(12) United States Patent
Miida

(10) Patent No.: US 7,279,384 B2
(45) Date of Patent: Oct. 9, 2007

(54) SEMICONDUCTOR MEMORY AND METHOD FOR MANUFACTURING THE SAME

(75) Inventor: Takashi Miida, Kanagawa (JP)

(73) Assignee: Innotech Corporation, Yokohama-shi (JP)

( * ) Notice: Subject to any disclaimer, the term of this patent is extended or adjusted under 35 U.S.C. 154(b) by 0 days.

(21) Appl. No.: 11/283,984

(22) Filed: Nov. 22, 2005

(65) Prior Publication Data

US 2006/0108630 A1 May 25, 2006

(30) Foreign Application Priority Data

Nov. 24, 2004 (JP) ............... 2004-339635

(51) Int. Cl.
*H01L 21/336* (2006.01)
(52) U.S. Cl. ............... 438/257; 438/259; 438/262; 257/E21.68
(58) Field of Classification Search ............... 438/257, 438/259, 262, 264; 257/E21.68
See application file for complete search history.

(56) References Cited

U.S. PATENT DOCUMENTS

| | | | |
|---|---|---|---|
| 6,812,518 B2* | 11/2004 | Miida | 257/315 |
| 6,861,315 B1 | 3/2005 | Chen et al. | |
| 2004/0169219 A1 | 9/2004 | Miida et al. | |
| 2005/0190605 A1* | 9/2005 | Miida | 365/185.24 |

* cited by examiner

*Primary Examiner*—Minh-Loan Tran
(74) *Attorney, Agent, or Firm*—Birch, Stewart, Kolasch & Birch, LLP

(57) ABSTRACT

A semiconductor memory has plural cell transistors that are arranged in a matrix. The cell transistor comprises a P type silicon substrate, a control gate CG and a pair of electrically isolated floating gates. Plural projections are formed in the silicon substrate, and a pair of N type diffusion regions as the source and the drain is formed in both sides of the projection. The control gate extending in the row direction faces the projection and the floating gate FG1, FG2 via an insulation layer. The width W1 of the floating gate FG1, FG2 in the column direction is larger than the width W2 of the control gate CG, so the floating gate FG1, FG2 and the control gate CG can be manufactured without the self-align process.

3 Claims, 54 Drawing Sheets

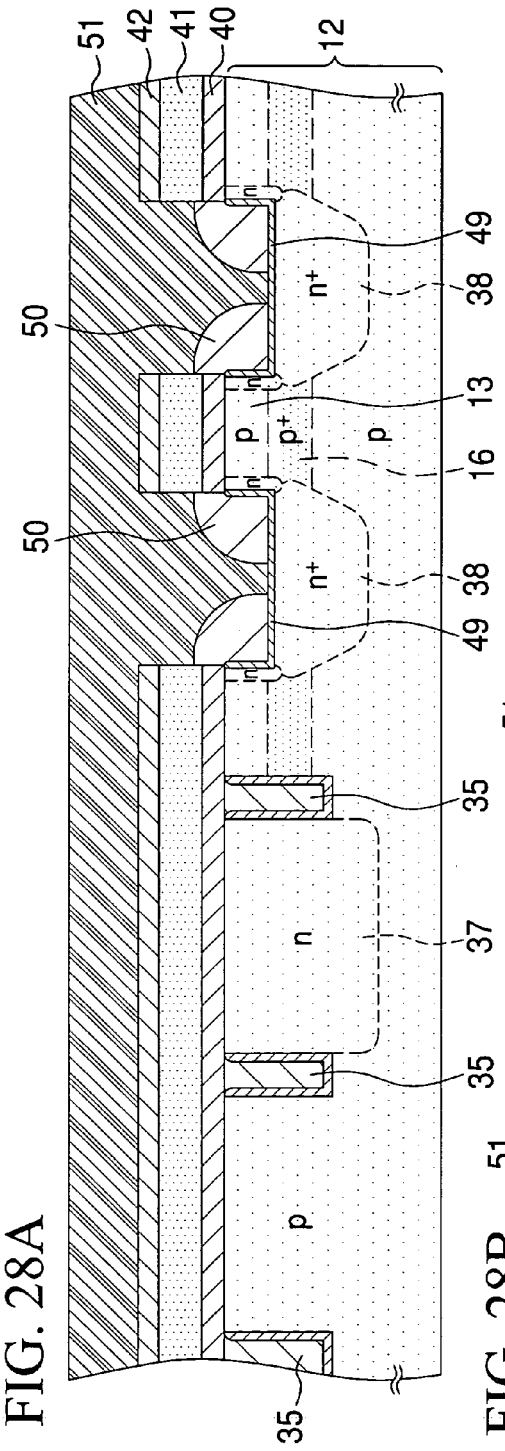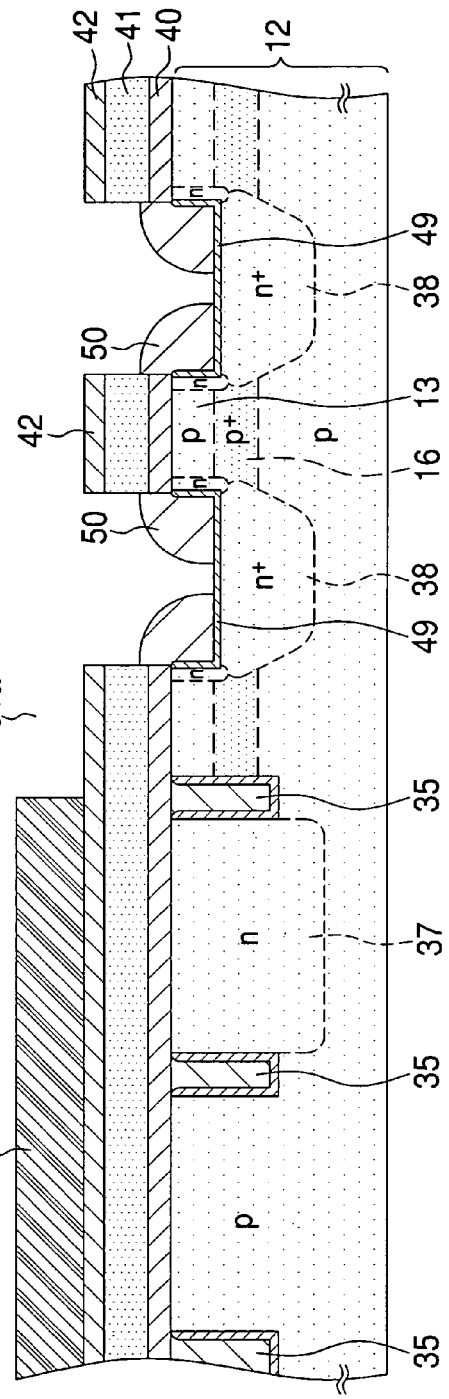
FIG. 28A
FIG. 28B

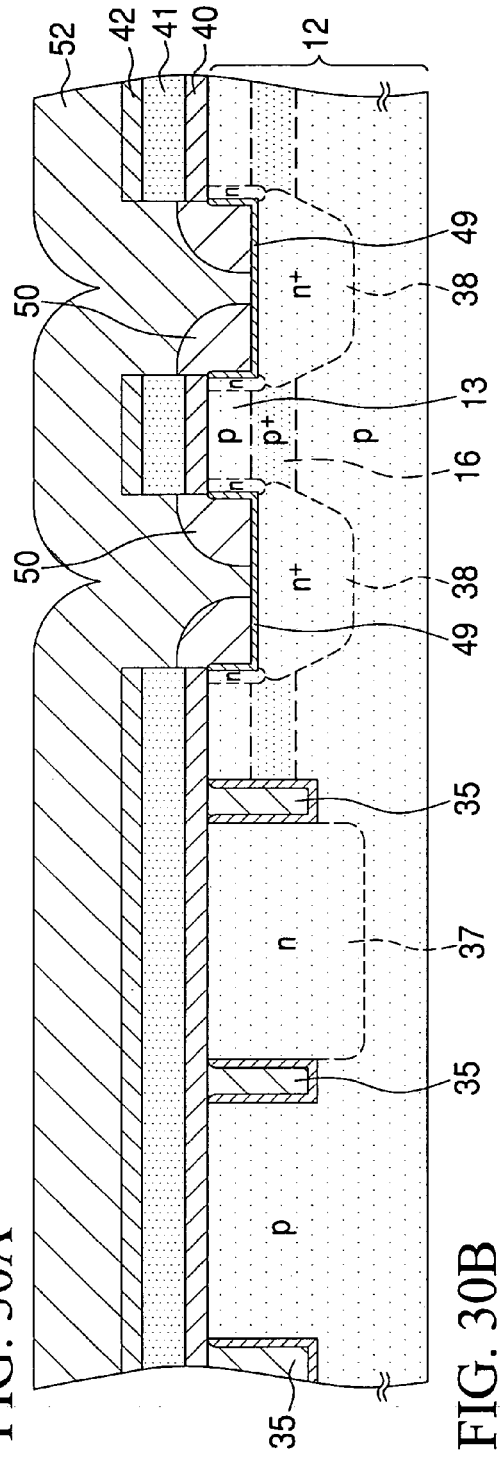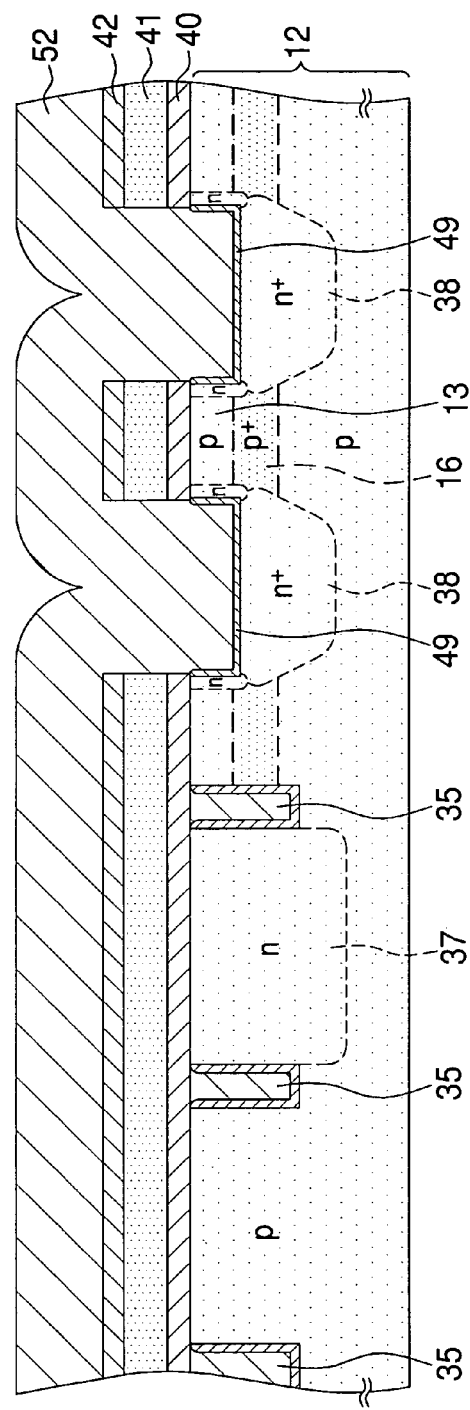

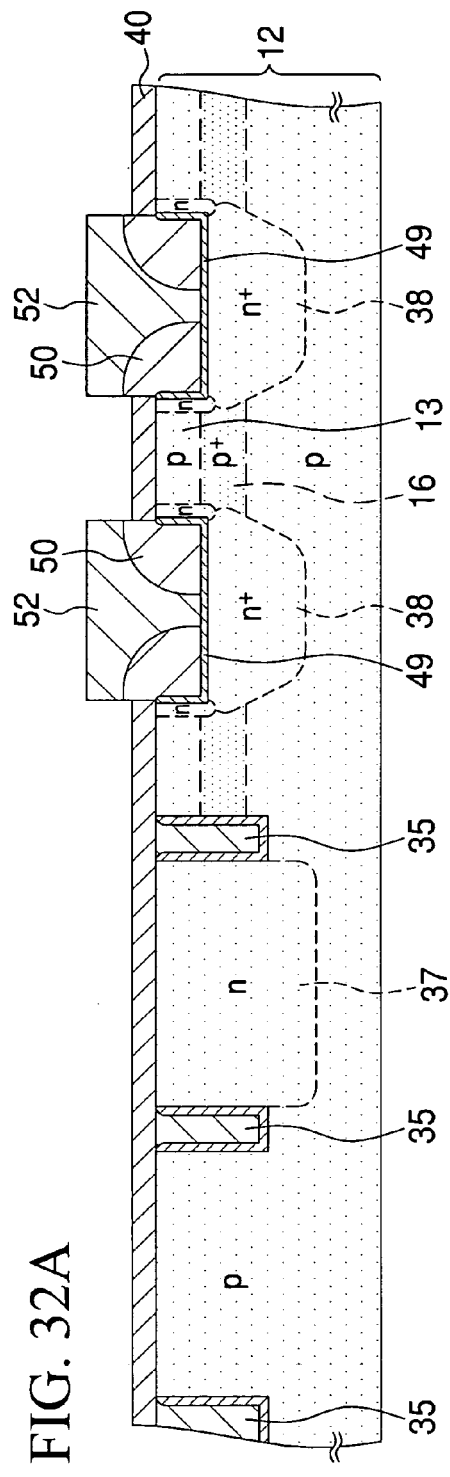

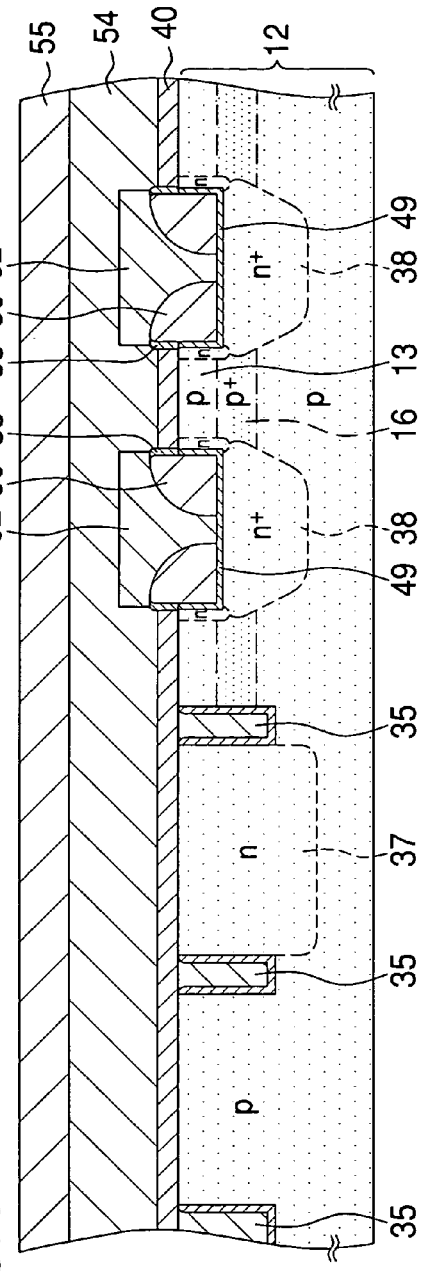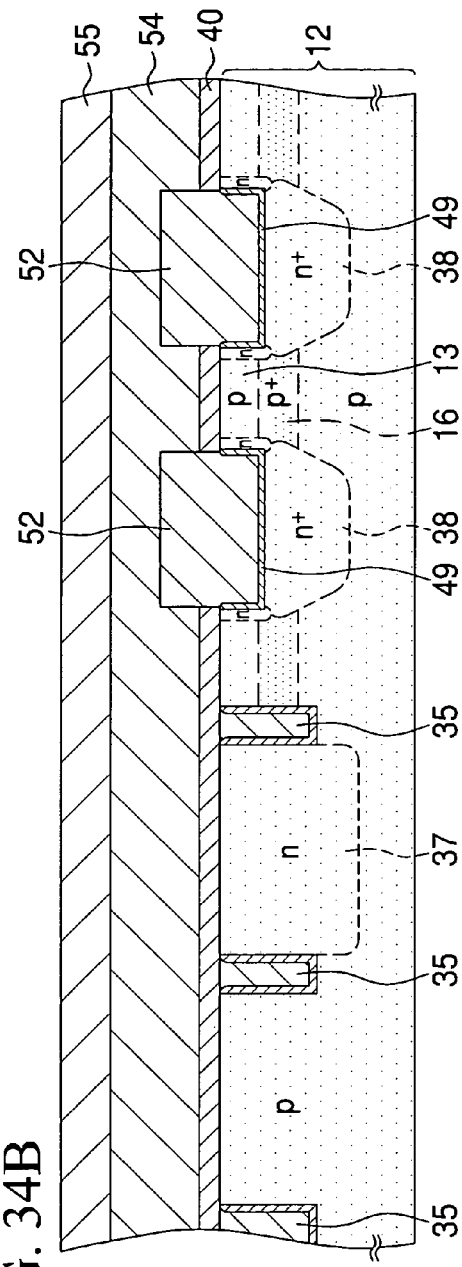
FIG. 34A
FIG. 34B

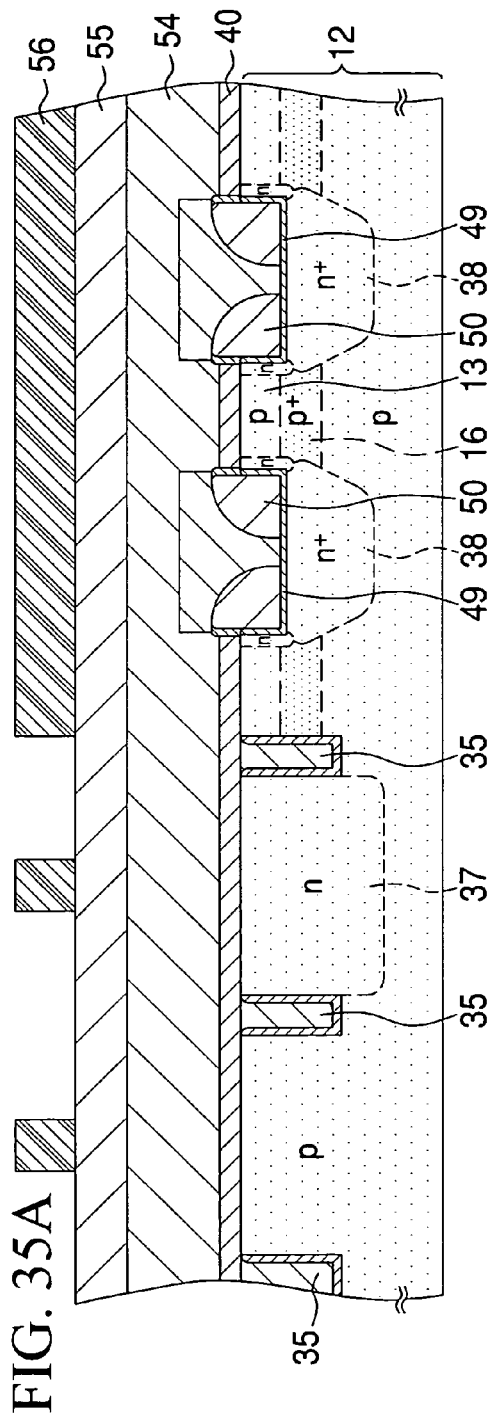
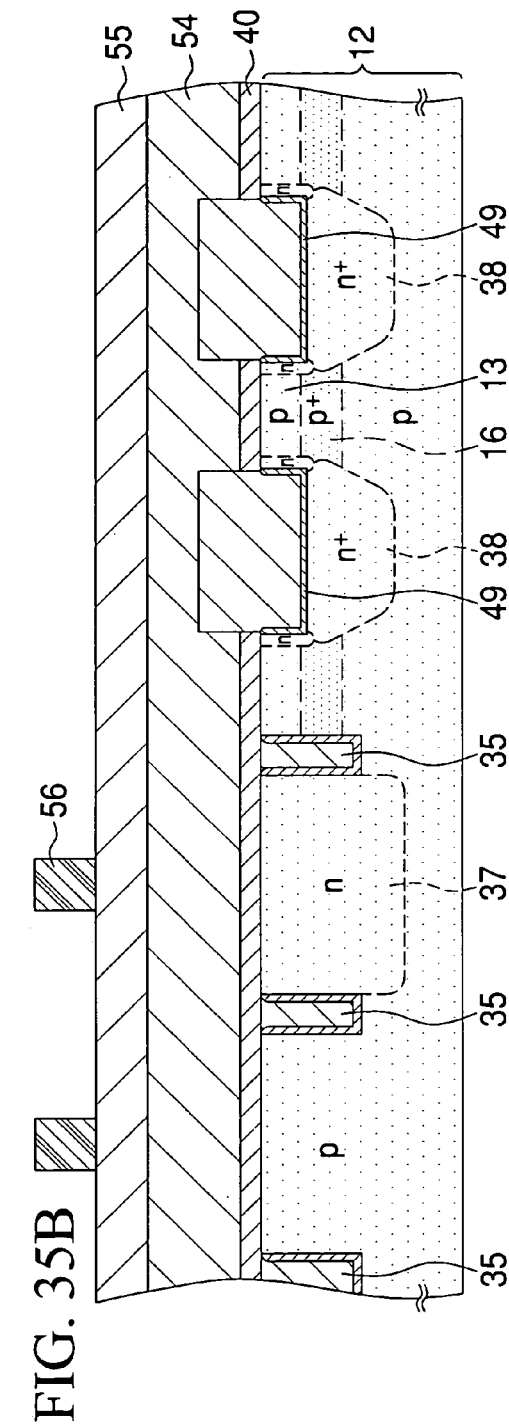
FIG. 35A
FIG. 35B

SEMICONDUCTOR MEMORY AND METHOD FOR MANUFACTURING THE SAME

BACKGROUND OF THE INVENTION

1. Field of the Invention

The present invention relates to a semiconductor memory having transistor cells each of which stores multiple bit data, and a method for manufacturing such semiconductor memory.

2. Description of Background Art

A nonvolatile semiconductor memory such as a flash memory is widely applied to electronic appliances like a mobile telephone. In order to promote size reduction and larger information capacity of the electronic appliances, it is required to miniaturize the semiconductor memory and increase the storage capacity of the semiconductor memory. Thus, there should preferably be implements the multiple-bit configuration of a cell transistor that allows two or more bit data to be stored in a single cell transistor. The nonvolatile semiconductor memory described in US 2004/0169219 A1, filed by the assignee of the present application, has cell transistors each of which comprises a pair of floating gates that are electrically isolated and stores two bits (four values) of information.

FIG. 54 shows a conventional cell array (memory cell array) 100 that has plural bit lines BL extending in a column direction, plural word lines WL extending in a row direction, and electrically isolated floating gates FG1, FG2 that are formed in the intersected area between the bit line BL and the word line WL. The cell transistor 101 is formed in an encircled area of FIG. 54 in which the bit line BL and the word line WL are intersected.

In FIG. 55, the sectional view of the cell transistor 101 taken on the line D-D of FIG. 54 is illustrated. The cell transistor 101 comprises a control gate CG (word line WL), a pair of diffusion regions 102 that serves as the source and the drain. When the control gate CG, the source and the drain regions are supplied with predetermined voltages, a channel is generated in the top and side surfaces of a projection 104 that is formed on a silicon substrate 103. In data writing operation of the cell transistor 101, some electrons (charged particles) in the channel are supplied with enough energy to become hot electrons that can pass the potential barrier in a first insulation layer 105 and flow into a drain side floating gate. In data reading operation to read the information from the cell transistor 101, the electric current flowing in the channel (drain current) is modulated in accordance with the amount of the electrons in the source side floating gate. In deleting the information in the cell transistor 101, there is no channel in the projection 104, and the electrons in the floating gates FG1, FG2 are discharged to the control gate CG through a second insulation layer 106 by FN (Fowler Nordheim) tunneling.

As illustrated in FIG. 54, the width in the column direction of the floating gates FG1, FG2 is equal to the width of the word line WL. Such floating gates FG1, FG2 are formed by patterning the word lines WL, and by patterning the conductive material for the floating gate covered with an insulation layer. In the patterning process of the conductive material, the insulation layer on the word line WL serves as the hard mask. In other words, the floating gates FG1, FG2 are formed by the self-align process in the column direction with respect to the word lines WL.

In forming the floating gates FG1, FG2 by the self-align process, it is required to etch a portion of the insulation layer covering the conductive material for the floating gate to expose the surface of the conductive layer, and then to etch the conductive material. In etching the insulation layer covering the conductive material, the insulation layers 105-107 are damaged. Such cell transistor 101 with the damaged insulation layers 105-107 becomes less reliable in operation. As described so far, the self-align process to form the floating gates and the word lines (control gates) still has some problems, so it is desired to solve the problems

SUMMARY OF THE INVENTION

An object of the present invention is to provide a semiconductor memory that is manufactured easily and has excellent reliability in operation.

Another object of the present invention is to provide a method to manufacture such semiconductor memory.

In order to achieve the above objects, the semiconductor memory according to the present invention, the semiconductor memory according to the present invention has plural cell transistors formed on a one conductive type semiconductor substrate. The cell transistors are arranged in a first direction and a second direction perpendicular to the first direction to form a two-dimensional matrix. The cell transistor comprises a first projection formed in the semiconductor substrate, a pair of opposite conductive type regions as the source and the drain of the cell transistor, a control gate, and a pair of floating gates each of which is electrically isolated and has a side surface that faces the first projection and the control gate. The first projection extends in the first direction.

The opposite conductive type regions are formed in both sides of the first projection in the semiconductor substrate, and serves as the source and the drain of the cell transistor. The floating gate faces the opposite conductive type region via a first insulation layer that contacts the surfaces of the opposite conductive type regions and a part of the side surfaces of the first projection. The control gate extends in the second direction and is located above the first projection and the floating gate. The width of the floating gate in the first direction is larger than the width of the control gate. A second insulation layer formed between the first projection and the control gate.

The floating gate has a side surface facing the first projection, the cell transistor has a third insulation layer formed in the area in which the side surface of the floating gate is not covered with the first insulation layer, and the side surface of the control gate faces the control gate via the third insulation layer.

In a preferred embodiment, the control gate comprises a second projection that projects in the direction opposite to the first projection, and the first projection faces the second projection via the fourth insulation layer. The capacitance between the floating gate and the semiconductor substrate is preferably larger than the capacitance between the floating gate and the control gate.

In the semiconductor memory, two adjacent cell transistors in the row direction share the opposite conductive type region. In the column direction, the cell transistors share the pair of the opposite conductive type regions. The control gates of the cell transistors arranged in the column direction are electrically integrated with one another.

The cell transistor may comprise a pair of conductive regions that are formed by injecting opposite type impurity ions in the semiconductor substrate. The cell transistor may comprise a one conductive type high impurity region formed between the pair of opposite conductive regions. The impurity density of the high impurity region is larger than that of the semiconductor substrate.

When the control gate and the pair of opposite conductive type regions are respectively supplied with voltages for data writing or data reading, a channel is generated in the side surfaces and the top surface of the projection. A part of charged particles to be flowed in the channel enter the floating gate of drain side when the control gate and the pair of opposite conductive type regions are respectively supplied with voltages for data writing. The current flowing in the channel is modulated in accordance with the amount of charged particles in the floating gate of source side when the control gate and the pair of opposite conductive type regions are respectively supplied with voltages for data reading. When the control gate and the pair of opposite conductive type regions are respectively supplied with voltages for data erasing, the charged particles in the floating gate are discharged to the control gate.

The semiconductor memory having plural cell transistors is formed by the following steps. In the semiconductor substrate, plural trenches extending in the first direction are formed to have plural projections each of which has a pair of side surfaces. Opposite type impurity ions are implanted to the trenches to form opposite conductive type regions as the source and the drain in the semiconductor substrate. A first insulation layer is formed in the surface of the opposite conductive type region and the side surface of the projection. A first conductive material is deposited in both side surfaces and on the opposite conductive type region to form floating gates, each of which has a side surface that faces the projection via the first insulation layer. The first conductive material is divided with respect to the first direction to form a pair of floating gates. The floating gate has a side surface that faces the projection via the first insulation layer. After depositing a second conductive material on the whole surface, the portion of the second conductive material that is not covered with a stripe-shaped resist mask is etched to form a control gate. The resist mask extends in a second direction perpendicular to the first direction, the control gate faces the top side of the projection via a second insulation layer, and the width of the resist mask in the first direction is smaller than the width floating gate.

A third insulation layer may be formed in the part of the side surface of the floating gate that is not covered with the first insulation layer.

The control gate is formed by depositing a mask insulation layer on the second conductive material, forming the resist mask on the mask insulation layer, etching the portion of the mask insulation layer that is not covered with the resist mask, removing the resist mask and etching the portion of the second conductive material that is not covered with the mask insulation layer.

According to the present invention, since the width of the floating gate in the first direction is larger than the width of the control gate, it is possible to ensure to form the control gate above the floating gate, and thus to manufacture the semiconductor memory without the self-align process.

According to the present invention, since the control gate is formed by depositing the second conductive material on the whole surface after dividing the first conductive material, and etching the portion of the second conductive material that is not covered with a stripe-shaped resist mask, the insulation layer covering the floating gate is not damaged during the process to form the control gate. Thus, semiconductor memory with excellent properties can be manufactured.

BRIEF DESCRIPTION OF THE DRAWINGS

The above objects and advantages of the present invention will become easily understood by one of ordinary skill in the art when the following detailed description would be read in connection with the accompanying drawings, in which:

FIGS. 7 through 47 are sections demonstrating a series of processes to manufacture the cell transistor;

PREFERRED EMBODIMENTS OF THE INVENTION

The embodiment of the present invention is described in detail hereinafter with reference to the accompanying drawings.

Figure 1:
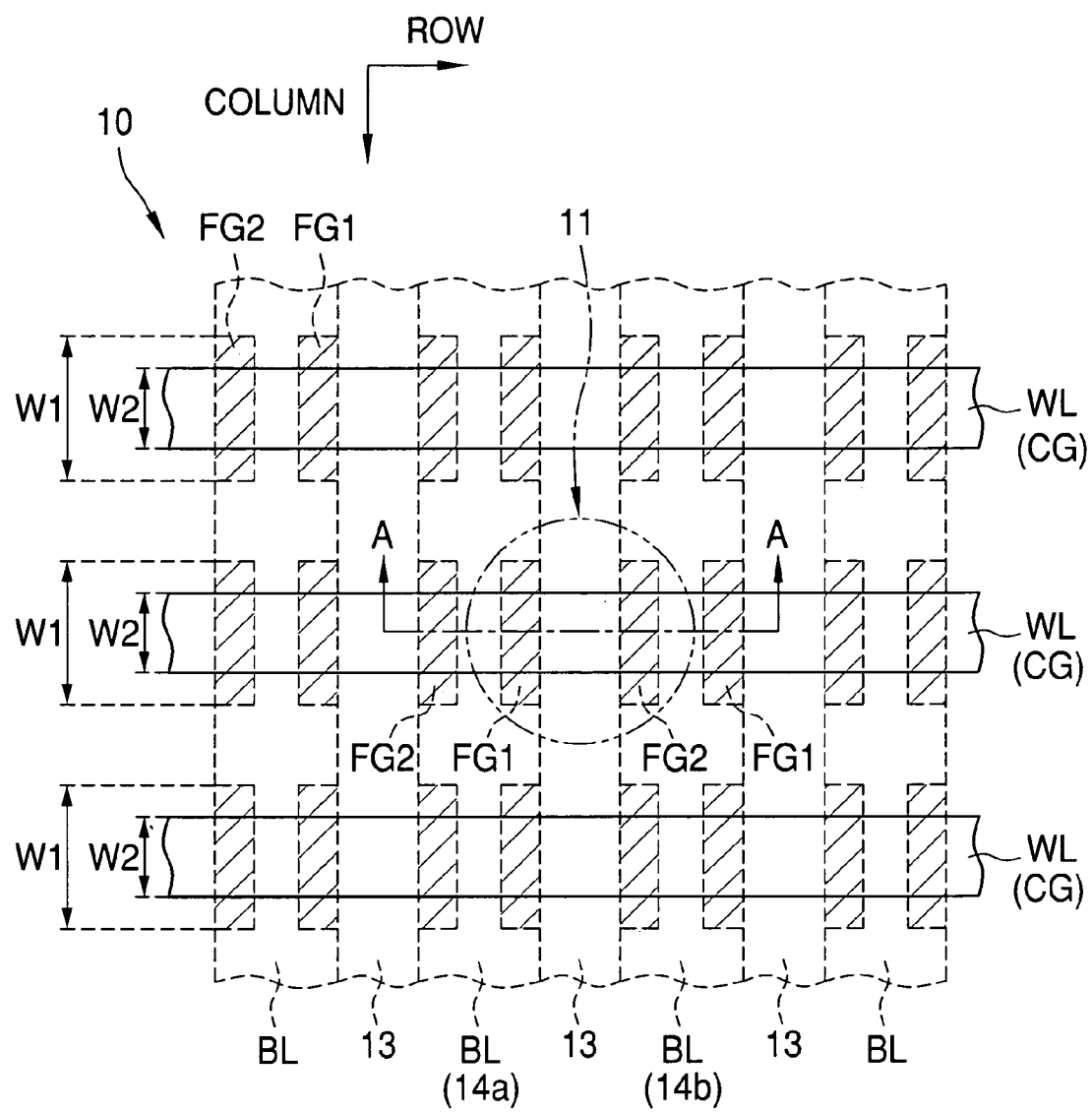
FIG. 1 is a top plan view showing the layout of a memory cell array embodying the present invention.

Referring to FIG. 1, a memory cell array 10 has a VGA (Virtual Ground Array) configuration in which plural bit lines (BL) and plural word lines (WL) are intersected. The bit line has a diffusion region that extends in a column direction (first direction). The word line is formed of conductive silicon that extends in a row direction. In the intersected area of the word line WL and the bit line BL, there are a pair of floating gates FG1 and FG2 that are electrically isolated from each other. The memory cell array 10 is in a form of a matrix having plural cell transistors 11. A single cell transistor 11 is depicted in a circled area of FIG. 1. The width W1 of the floating gates FG1, FG2 with respect to the column direction is larger than the width W2 of the word line WL. In the column direction, the floating gates FG1, FG2 stick out of the word line WL by the same length ((W1−W2)/2).

Figure 2:
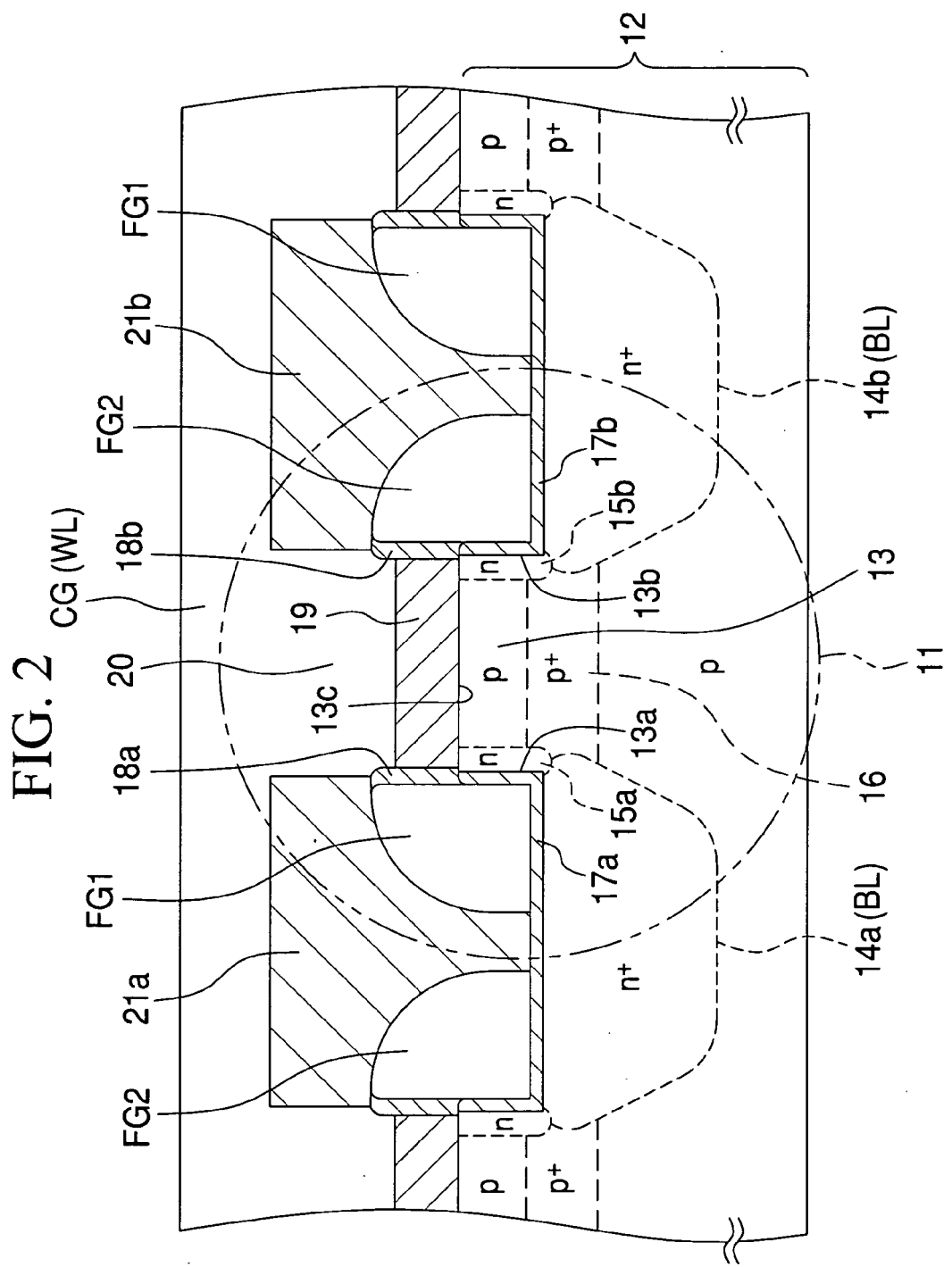
FIG. 2 is a cross section of a cell transistor taken on the line A-A of FIG. 1.

In FIG. 2, the section of the cell transistor 11 taken on line A-A is illustrated. The P type (one conductive type) silicon substrate 12 has plural projections 13 each of which projects upward and extends in the column direction (the direction perpendicular to the drawing sheet). The projection 13 has a pair of side surfaces 13a, 13b facing to each other, and a top surface 13c. On the surface of the silicon substrate 12, a pair of N type (opposite conductive type) diffusion regions (opposite conductive regions) 14a, 14b extend in the column direction. The projection 13 is positioned between the diffusion regions 14a, 14b. The diffusion regions 14a, 14b are the bit lines (BL), and serve as the source and the drain of the cell transistor 11.

The side surfaces 13a, 13b are in contact with the N type regions 15a, 15b, respectively, in which N type impurity ions are implanted. In the N type regions 15a, 15b, a part of a channel that will be described later is formed. Below the projection 13 between the diffusion regions 14a, 14b is formed a high impurity region 16 in which the P type impurity concentration increases. The high impurity region 16 is a region (punch through region) for preventing the punch through to flow the electrons (charged particles) directly between the source and the drain without flowing the channel.

The floating gates FG1, FG2 having a planer side surface and a bottom surface are formed from conductive silicon (amorphous silicon or poly silicon), so the floating gates FG1, FG2 are electrically conductive. The section of the floating gates FG1, FG2 taken along the row direction is fan-shaped. The flat side surface of the floating gate FG1, FG2 faces the side surface 13a, 13b of the projection 13 via a first insulation layer 17a, 17b, and faces a projection 20 via a second insulation layer 18a, 18b. The projection 20 is formed in the control gate CG and projects downward toward a third insulation layer 19. The bottom surface of the floating gate FG1, FG2 faces the diffusion region 14a, 14b via the first insulation layer 17a, 17b.

The control gate CG is formed of conductive silicon (amorphous silicon or poly silicon), and constitutes the word line WL of the memory cell array 10 of FIG. 1. The top surface of the projection 20 formed in the control gate CG is faced to the top surface 13c of the projection 13 formed in the silicon substrate via the third insulation layer (gate insulation layer) 19. The side surface of the projection 20 is partially faced to the side surface of the floating gate FG1, FG2 via the second insulation layer 18a, 18b.

An insulator 21a, 21b is filled in the area between the floating gates FG1, FG2 of adjacent cell transistors 11 in the row direction. The insulator 21a, 21b electrically separates the floating gates FG1, FG2 arranged in the row direction, and electrically isolates the curved surface of the floating gate FG1, FG2 and the control gate CG. The floating gates FG1, FG2 of the adjacent cell transistors 11 are electrically separated by an insulator (not illustrated). The above mentioned insulators and insulation layers are formed from silicon oxide ($SiO_2$), for example.

The above described cell transistor 11 is an N type MOS (Metal Oxide Semiconductor) transistor in which the diffusion region 14a, 14b as the source serve as a pair of the source and the drain. One of the diffusion regions 14a, 14b serves as the source, and the other diffusion region serves as the drain. The source and the drain can be exchanged in accordance with the applied voltage to the diffusion regions 14a, 14b. When a predetermined voltage is applied to the control gate CG and the source/drain of the cell transistor 11, an inverse layer as the electron passage is generated in the top surface 13c of the projection 13, and thus a channel to pass the electrons is generated in the whole surface of the projection 13 including the N type regions 15a, 15b.

Figure 3:
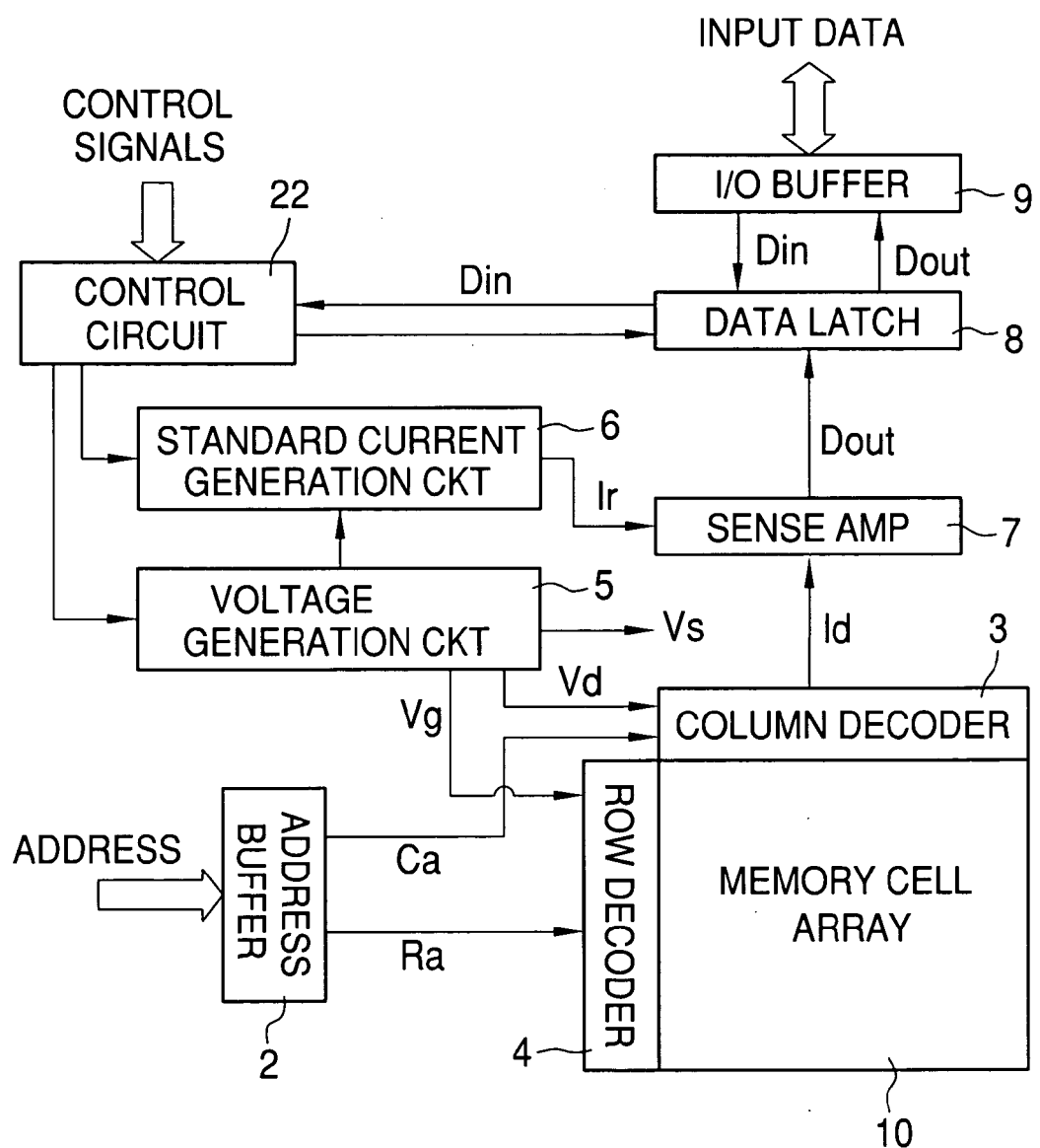
FIG. 3 is a block diagram of an electrical configuration of a semiconductor memory according to the present invention.

FIG. 3 shows the configuration of the semiconductor memory having the memory cell array 10 and circuits to drive the memory cell array 10. The semiconductor memory comprises an address buffer 2, a column decoder 3, a row decoder 4, a voltage generation circuit 5, a standard current generation circuit 6, a sense amplifier 7, a data latch 8, an I/O buffer 9 and a control circuit 21. The address buffer 2 amplifies the address signals that are externally inputted to the semiconductor memory. The column decoder 3 decodes the column address signals Ca from the address buffer 2 to select the bit line BL. The row decoder 4 decodes the row address signals Ra from the address buffer 2 to select the word line WL. Thereby, it is possible to select the designated cell transistor 11 in the memory cell array 10 by the address signals.

The voltage generation circuit 5 generates voltage in the writing, reading and erasing operations, and applies the drain voltage Vd via the column decoder 3 to the designated bit line BL as the drain. The voltage generation circuit 5 applies the gate voltage Vg via the row decoder 4 to the designated word line WL. The voltage generation circuit 5 can supply the substrate voltage Vs to the silicon substrate 12.

The sense amplifier 7 detects the readout current (drain current) Id flowed from the bit line BL (drain) in the reading operation. The sense amplifier 7 detects the standard current Ir from the standard current generation circuit 6, and compares the readout current Id with the standard current Ir. Then, the sense amplifier 7 outputs data Dout ('0' or '1') as the result of comparison, and the output data Dout is sent to the data latch 8. The output data Dout is '0' when the readout current is smaller than the standard current (Id<Ir). The output data Dout is '1' when the readout current is larger than the standard current (Id>Ir).

The data latch 8 stores the input data Dout, and outputs data Dout to an external circuit 22 via the I/O buffer 9. In the writing operation, the I/O buffer 9 amplifies externally inputted data Din and sends it to the data latch 8 that sends the input data Din to the control circuit 22.

In response to the input data Din and the externally inputted control signals, the control circuit 22 controls the operation of the surrounding circuit such as the voltage generation circuit 5, the standard current generation circuit 6 and the data latch 8, in the operation such as the reading and writing operations. Although not illustrated in the drawings, a voltage from a power source is supplied to each part of the surrounding circuit.

Figure 4A:
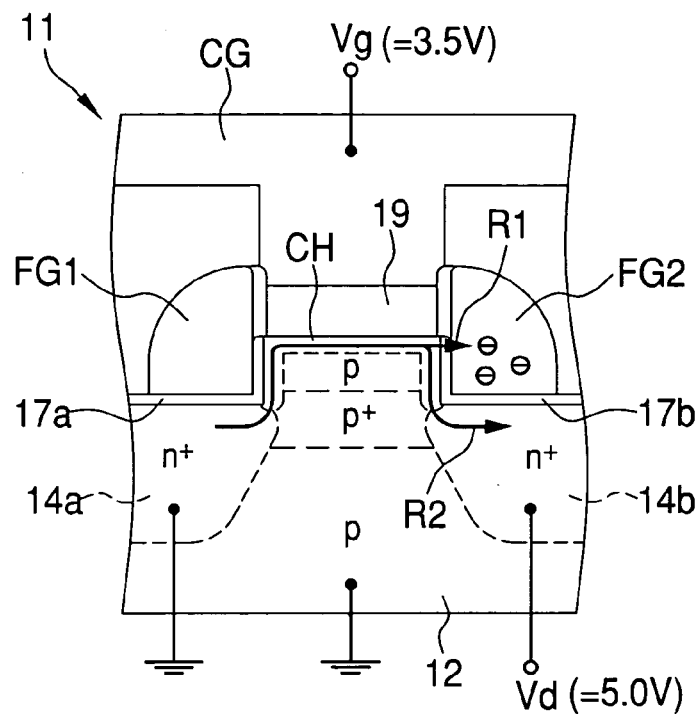
FIGS. 4A and 4B are explanatory views of a data writing operation of the cell transistor.

In FIG. 4A, a section of the cell transistor 11 in the writing operation is depicted. In the writing operation, the electrons are stored in one of the floating gates FG1, FG2. For example, in storing the electrons in the floating gate FG2, the voltage generation circuit 5 supplies the drain voltage Vd of 5.0V to the diffusion region 14b via the column decoder 3. In addition, the other diffusion region 14a and the substrate 12 are earthed, and the voltage generation circuit 5 supplies the gate voltage Vg of 3.5V to the control gate CG via the row decoder 4. It is to be noted that, in this example, the diffusion region 14a below the floating gate FG1 is the source, and the other diffusion region 14b below the floating gate FG2 is the drain.

These applied voltages in the writing operation (the gate voltage Vg and the drain voltage Vd) cause to generate an inversed layer near the top surface 13c of the projection 13, so the channel CH for the electron passage from the source to the drain is generated in the surface of the projection 13 including the side surfaces 13a, 13b. The electron passage from the source is divided into the passages R1, R2. In the passage R1, a part of the electrons are accelerated to have a large energy due to the potential between the source and the drain, and the electrons in the passage R1 become the hot electrons having large movement. The hot electrons go over the potential barrier of the first insulation layer 17b and enter the floating gate FG2. In the other passage R2, the electrons are scattered by the phonons and the impurities so that the electrons in the passage R2 lose the energy and cannot be the hot electrons. Thus, the electrons in the passage R2 flow into the drain, and about 600 electrons are accumulated in the drain. The electrons in the passage R1 enter the floating gate FG2 through the first insulation layer 17b. Since the side of the insulation layer 17b is substantially perpendicular to the direction of the passage R1, so the hot electrons can effectively enter the floating gate FG2. It is possible to set the diffusion region 14a as the drain and the other diffusion region 14b as the source. In that case, the electrons enter the floating gate FG1.

Figure 4B:
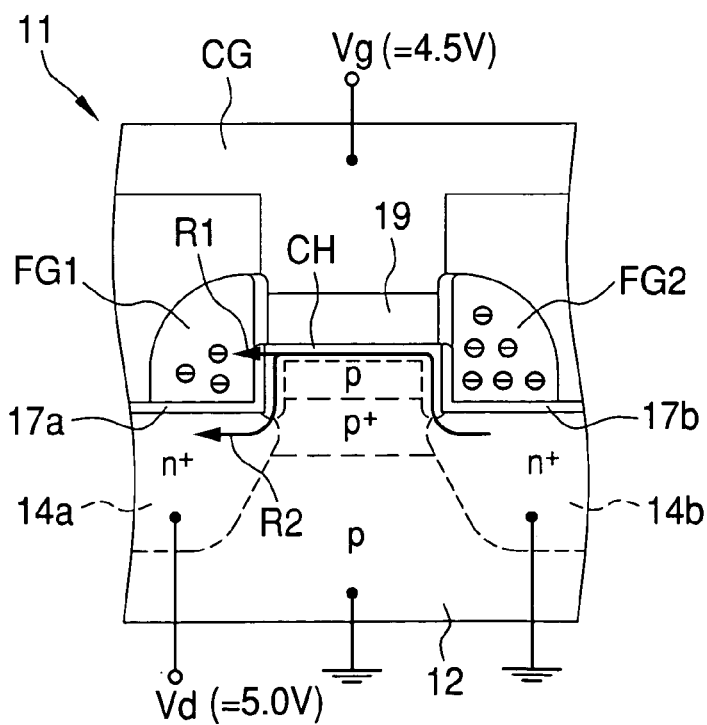

In FIG. 4A, the writing operation is carried out when the electrons are not accumulated in the source side floating gate. When the electrons are accumulated in source side floating gate, the channel CH is affected by the electrons in the source side floating gate in the writing operation, so the electron injection efficiency to the drain side floating gate decreases. A higher gate voltage Vg than the case of FIG. 4A makes it possible to improve the injection efficiency. FIG. 4B shows the section of the cell transistor 11 in the writing operation to inject the electrons in the floating gate FG1 while the electrons are accumulated in the other floating gate FG2. The drain voltage Vd is 5.0V, and the gate voltage Vg is 4.5V. These voltages are the same in the case where the electrons are injected in the floating gate FG2 while the electrons are accumulated in the floating gate FG1.

Figure 5:
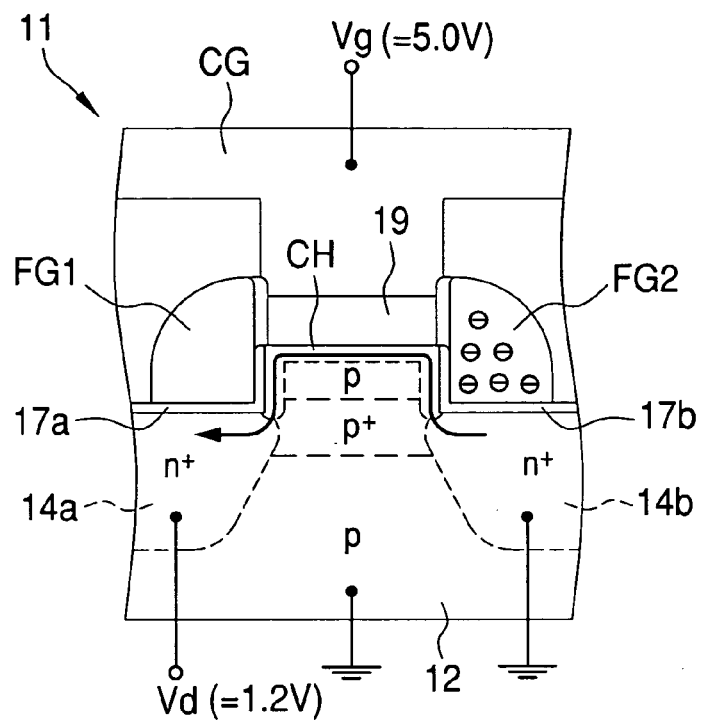
FIG. 5 is an explanatory view of a data reading operation of the cell transistor.

FIG. 5 shows a section of the cell transistor 11 in the reading operation to read information in the cell transistor 11. In the reading operation, the semiconductor memory checks the state of the floating gates FG1, FG2 individually. For example, in detecting the state of the floating gate FG2 of the cell transistor 11, the drain voltage Vd of 1.2V and the gate voltage Vg of 5.0V are respectively applied to the diffusion region 14a and the control gate CG. The other diffusion region 14b and the substrate 12 are earthed. In this example, the diffusion region 14a serves as the drain, and the diffusion region 14b serves as the source.

These applied voltages in the reading operation (the gate voltage Vg and the drain voltage Vd) cause to generate an inversed layer near the top surface 13c of the projection 13, so the channel CH for the electron passage from the source to the drain in the surface of the projection 13 including the side surfaces 13a, 13b. The electrons flow from the source to the drain through the channel CH. The drain current (readout current) Id is modulated by the amount of the electrons in the source side floating gate FG2. The drain current Id is slightly affected by the amount of the electrons in the drain side floating gate FG1, and thus it is possible not to consider the effect of the drain side floating gate FG1 to the drain current Id. This is because the coupling capacitance of the floating gates FG1, FG2 and the source/drain is large. That is, the source side floating gate FG2 is coupled to the source potential (earth level), and the potential of the drain side floating gate FG1 increases due to the drain voltage Vd.

Accordingly, in the event that the electrons are accumulated in the source side floating gate FG2, the readout current Id is modulated by the accumulated electrons and becomes smaller than the standard current Ir generated in the standard current generation circuit 6 (Id<Ir). The sense amplifier 7 compares the readout current Id with the standard current Ir, and the output data Dout becomes '0'. On the other hand, when the electrons are not accumulated in the source side floating gate FG2, the readout current Id is larger than the standard current Ir (Id>Ir). In that case, the output data Dout becomes '1'. The diffusion region 14a may be set as the source and the other diffusion region 14b as the drain, and the electron state in the floating gate FG1 can be checked in the same manner.

Figure 6:
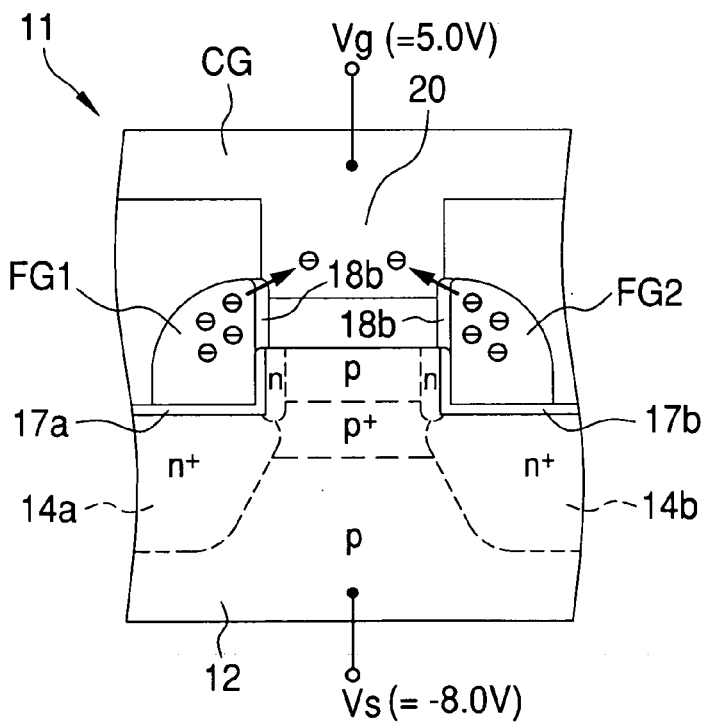
FIG. 6 is an explanatory view of a data erasing operation of the cell transistor.

FIG. 6 shows a section of the cell transistor 11 in the erasing operation to erase information in the cell transistor 11. In the erasing operation, the electrons accumulated in both floating gates FG1, FG2 are simultaneously discharged to the control gate CG. In the erasing operation is initiated, the substrate voltage Vs of −8.0V is applied to the silicon substrate, and the gate voltage Vg of 5.0V is applied to the control gate CG.

The floating gates FG1, FG2 are strongly capacitance coupled to the source/drain (silicon substrate 12), so the potential of the floating gate FG1, FG2 is closer to the potential of the silicon substrate 12 than the control gate CG. Thereby, a large potential gap to cause FN tunneling between the floating gate FG1, FG2 and the control gate CG is generated, and electrons are discharged to the control gate CG through the second insulation layer 18a, 18b. Especially, the electric field is concentrated in the part between the corners of the floating gates FG1, FG2 and the corners of the control gate CG. Due to such concentration in the electric field, most electrons in the floating gates FG1, FG2 pass the part of the second insulation layers 18a, 18b between the corners by FN tunneling, and enters the control gate CG. Since the electrons in the floating gates FG1, FG2 can be discharged through the small area in the second insulation layers 18a, 18b, it is possible to decrease the possibility to have defects in such small area. Thus, the floating gates FG1, FG2 can increase the property to keep the electrons. The above described date erasing operation is carried out simultaneously in the cell transistors 11 arranged in the row direction (for each word line WL).

If the floating gate FG1, FG2 does not store the data (electrons) before the erasing operation, the data writing operation (electron injection) may be carried out to the floating gate to uniform the electron state of the floating gate FG1, FG2 after the erasing operation. Then, the erasing operation is carried out.

In the erasing operation, it is preferable to perform so-called over erasure to set the floating gate FG1, FG2 electrically positive (for example, to discharge about 500 electrons from neutral state). The channel CH is directly on/off by the gate voltage Vg applied to the control gate CG, so the channel CH is not generated by the positive charges in the over-erased floating gate FG1, FG2 at the gate voltage Vg of 0V. Thereby, it is possible to prevent the leak current between the source and drain in the non-selected cell transistor 11.

In the way described above, the cell transistor 11 can store two bit data (four values), that is, "(0, 0), (0, 1), (1, 0), (1, 1)".

Next, an example of the manufacture of the semiconductor memory device is described with reference to the sectional views of FIGS. 7 through 47, and the top plan views of FIGS. 48 through 52. The cell array 10 can be manufactured on the same substrate as the CMOS circuit as the surrounding circuit. FIGS. 7 through 47 are section of the part of the cell array 10, N type MOS transistor and P type MOS transistor as the CMOS circuit taken on the line in the row direction. The structural parts behind the section of FIGS. 7 through 47 are not illustrated.

Figure 7:
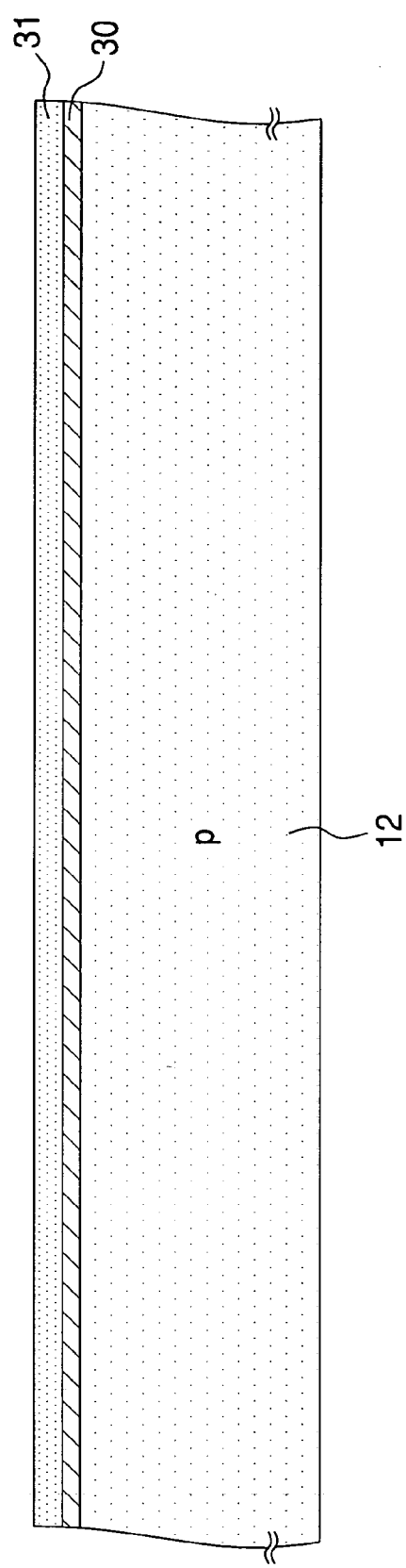

In FIG. 7, the silicon substrate 12 has the P type impurities (e.g. Boron B$^+$). The impurity density of the silicon substrate 12 is about $1.0 \times 10^{16}$ cm$^{-3}$. Then, a silicon oxide (SiO$_2$) layer 30 is formed in the surface of the silicon substrate 12 by thermal oxidization. Moreover, a silicon nitride ($Si_3N_4$) layer 31 is layered on the silicon oxide layer 30 by chemical vapor deposition (CVD).

Figure 8:
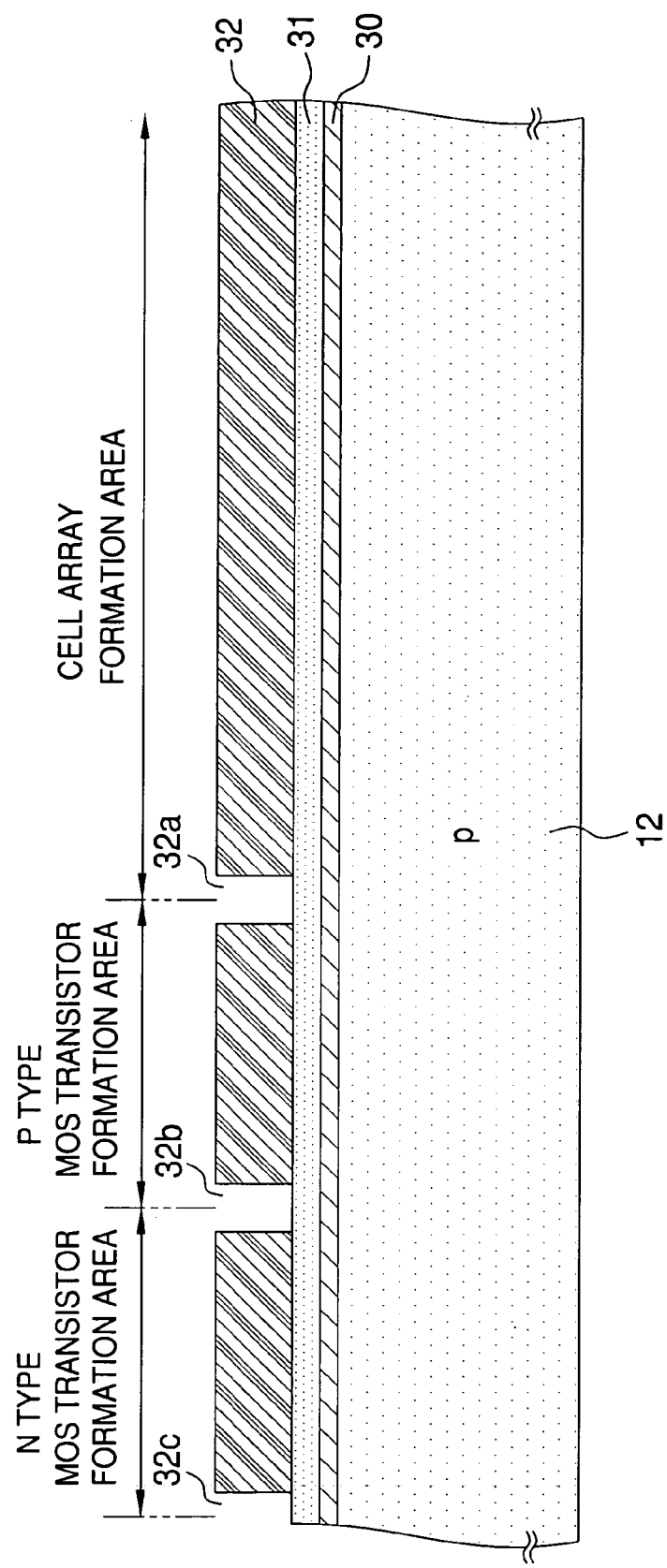

Then, a photo resist (photosensitive resin) is coated on the silicon nitride layer 31, and the photo resist on the silicon nitride layer 31 is subject to pattern exposure by use of a photo mask (rectile) having a predetermined pattern. After the pattern exposure, the photo resist is subject to the development process so that a resist mask 32 is formed on the silicon nitride layer 31, as shown in FIG. 8. Openings 32a-32c formed in the resist mask 32 corresponds to the areas between the cell array formation area, P type MOS transistor formation area, and N type MOS transistor formation area. The silicon nitride layer 31 is subject to the etching process through the resist mask 32 to remove the silicon nitride layer 31 in the area of the openings 32a-32c.

Figure 9:
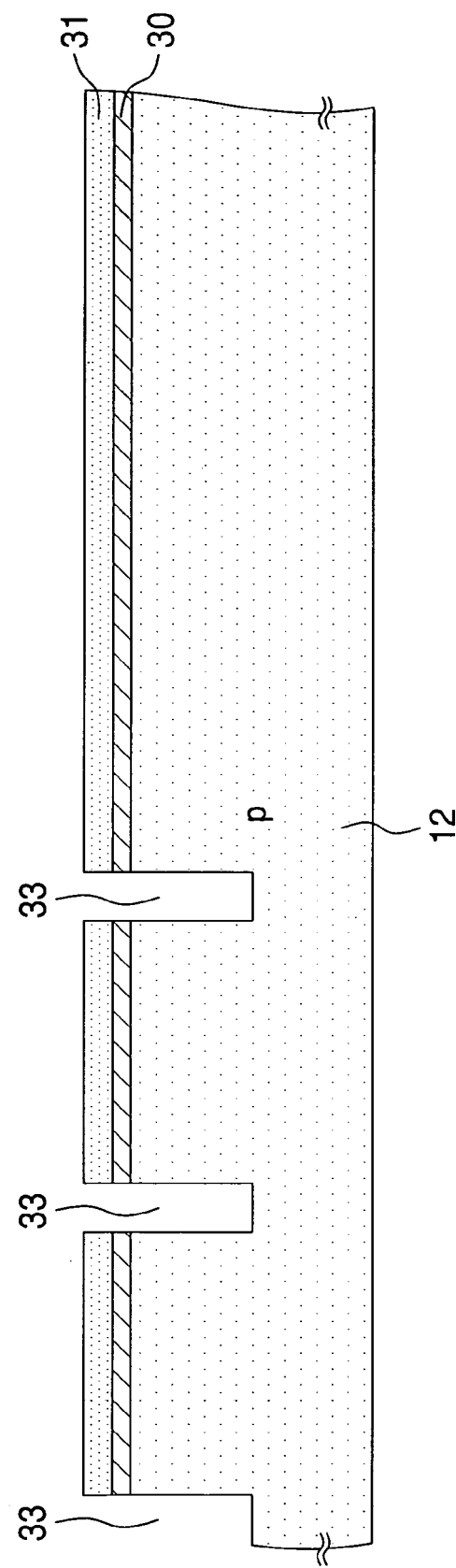
Figure 10:
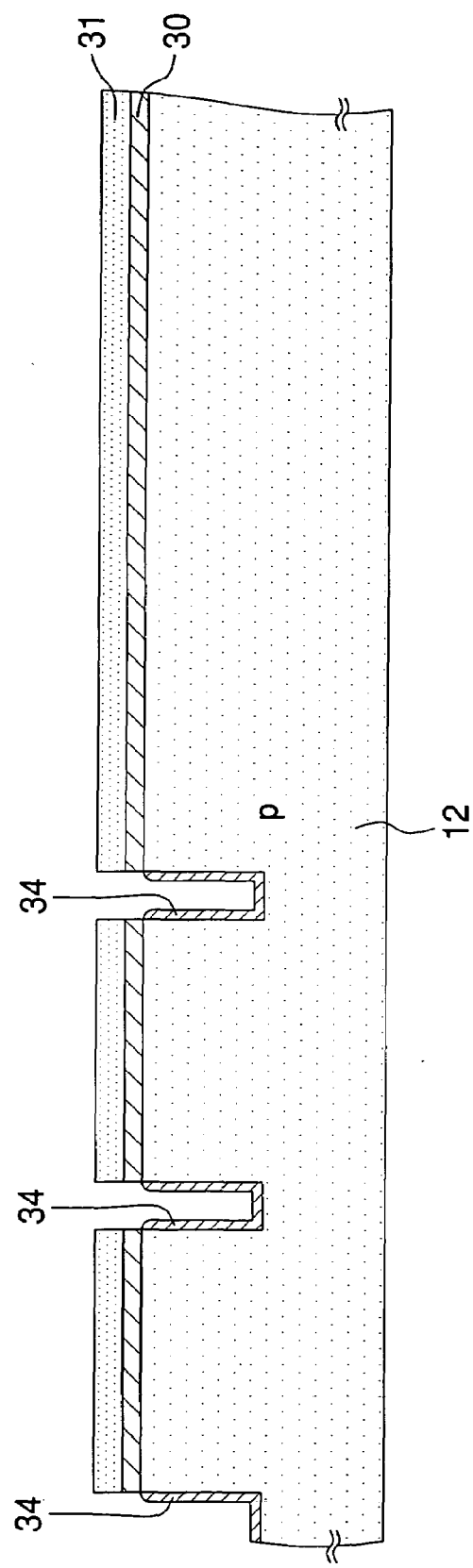

After the ashing process and the washing process to remove the mask 32, the silicon oxide layer 30 and the silicon substrate 12 are successively etched via the silicon nitride layer 31 as the hard mask. Thereby, as shown in FIG. 9, plural trenches (grooves) 33 are formed in the silicon substrate 12. Then, a thin silicon oxide layer 34 is formed in the surface of the trenches 33 by thermal oxidization, as shown in FIG. 10.

Figure 11:
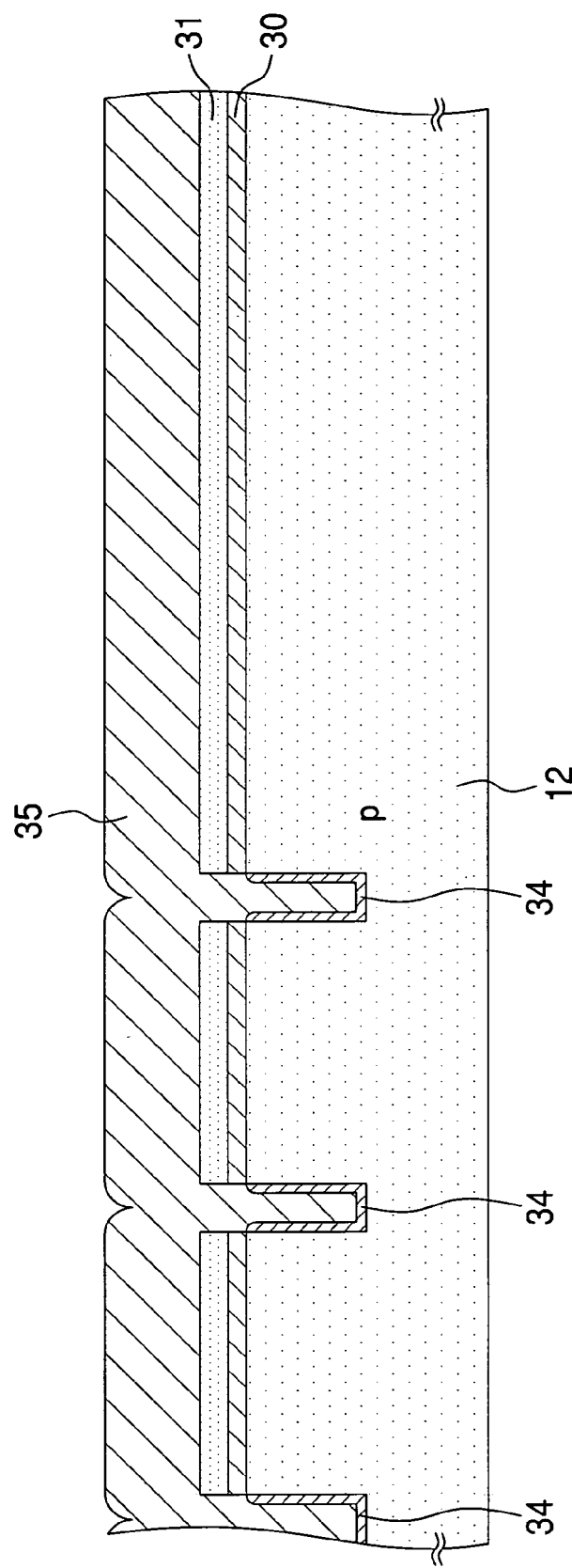
Figure 12:
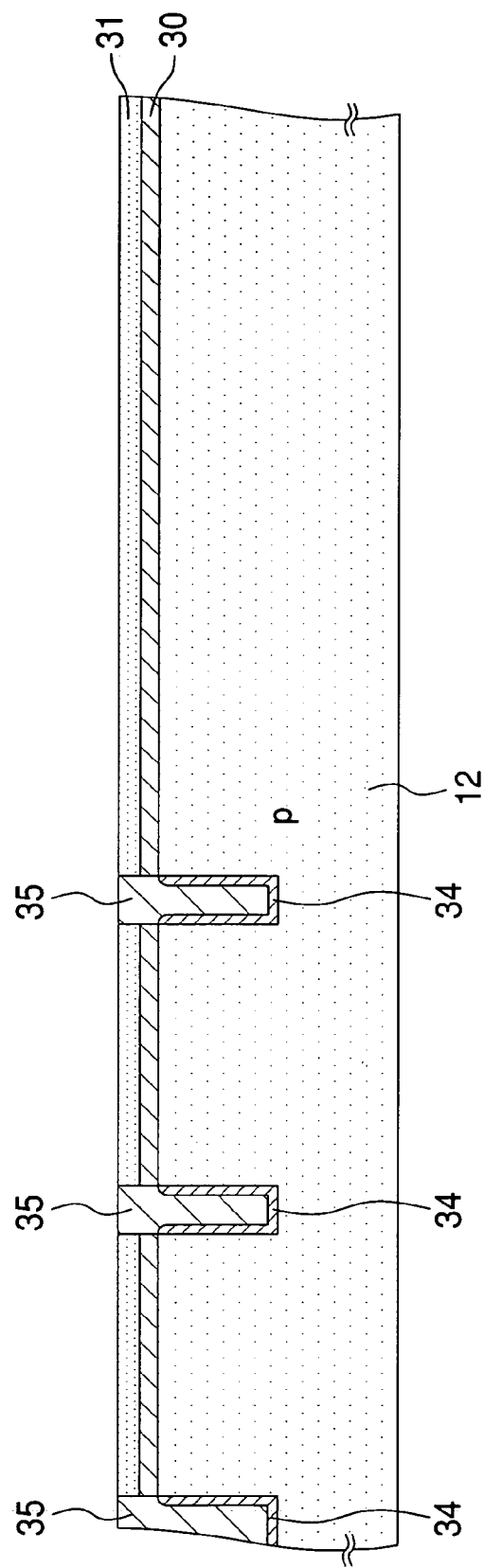

Referring to FIG. 11, a silicon oxide layer 35 for separation is deposited on the whole surface of the silicon substrate 12 to fill the trenches 33. The silicon oxide layer 35 is polished by CMP (Chemical Mechanical Polishing) to flatten the surface of the silicon substrate 12, as shown in FIG. 12. The polishing process is stopped when the silicon nitride layer 31 is exposed. Thereafter, the silicon nitride layer 31 is removed, and the process to flat the surfaces of the silicon oxide layers 30, 35 is carried out.

Figure 13:
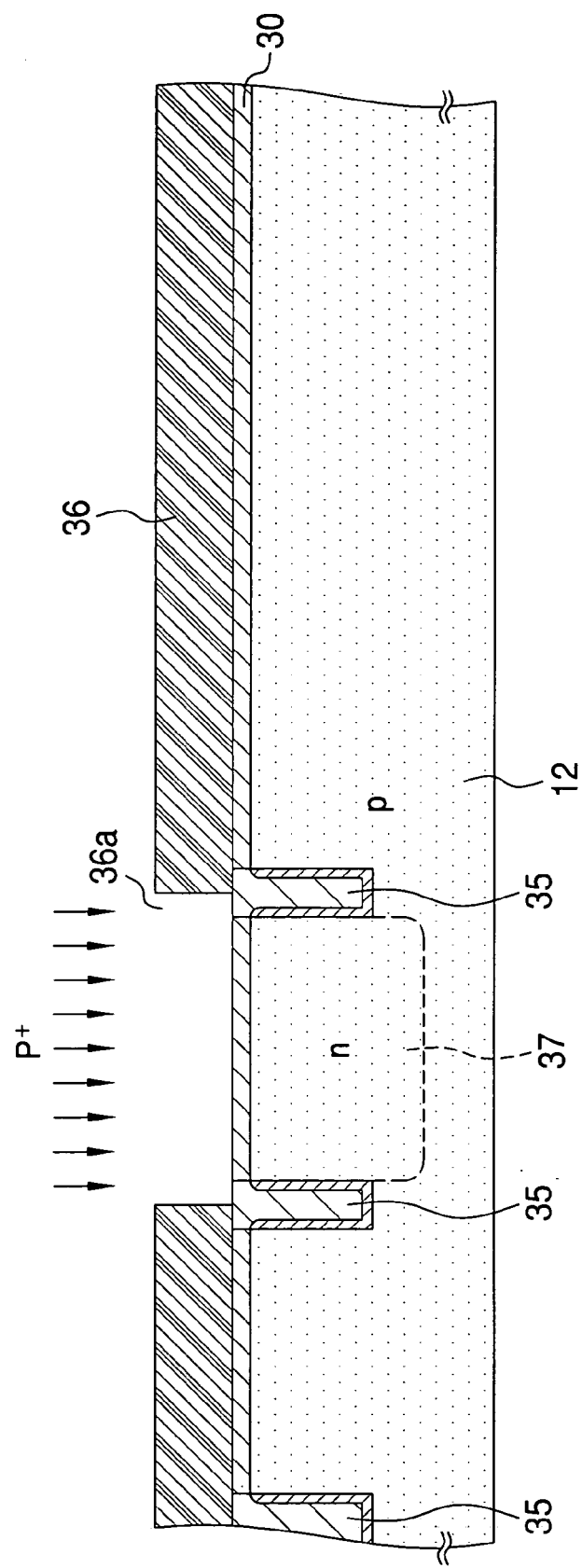

After a photo resist is coated, the photo resist is subject to the exposure process through the photo mask and the development process, so a resist mask 36 having an opening 36a in the P type MOS transistor formation area is formed, as shown in FIG. 13. Then, N type impurity ions (e.g. $P^+$ ions) are implanted in the silicon substrate 12 through the resist mask 36, so an N type well region 37 is formed below the opening 36a.

Figure 14:
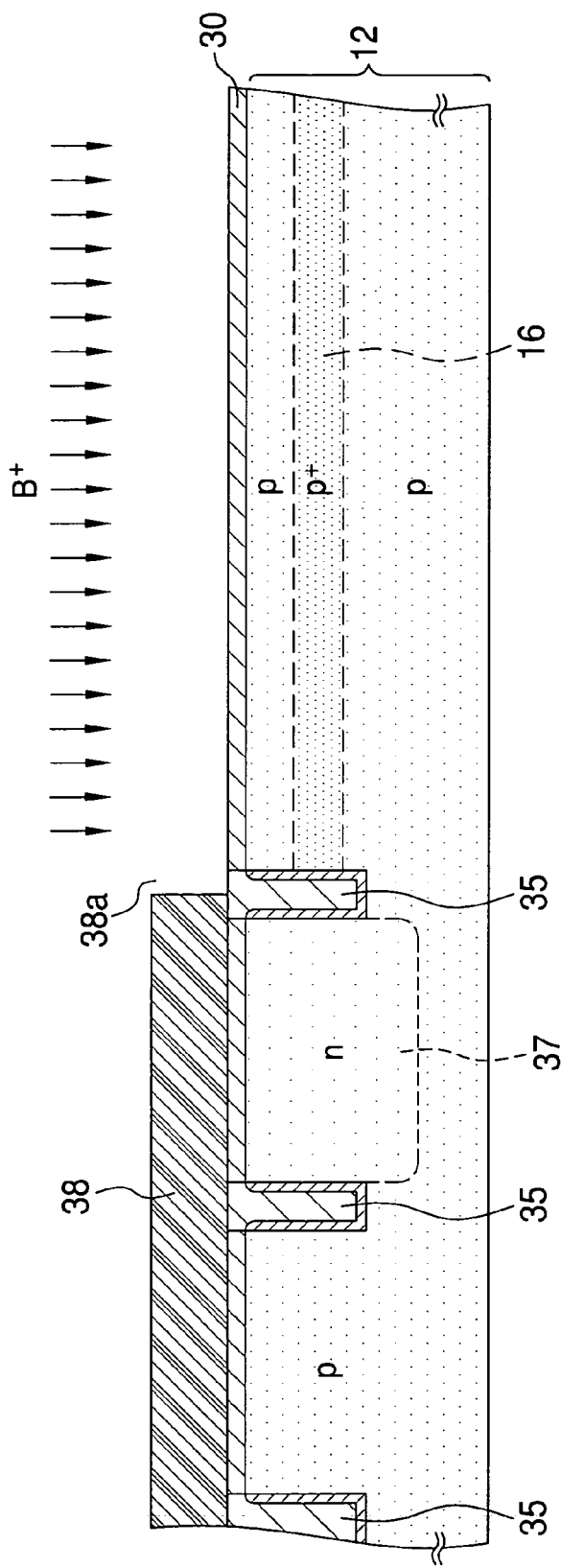

After removal of the resist mask 36 by ashing and the washing process, the photo resist is coated on the whole surface. Then, the photo resist is subject to the exposure process through the photo mask and to the development process, so a resist mask 38 having an opening 38a in the cell array formation area is formed, as shown in FIG. 14. Then, P type impurity ions (e.g. $B^+$ ions) are implanted in the silicon substrate 12 via the resist mask 36, so a high impurity density layer 16 having the impurity density of about $1.0 \times 10^{18}$ $cm^{-3}$ is formed in the area of 30-50 nm from the surface of the silicon substrate 12.

Figure 15:
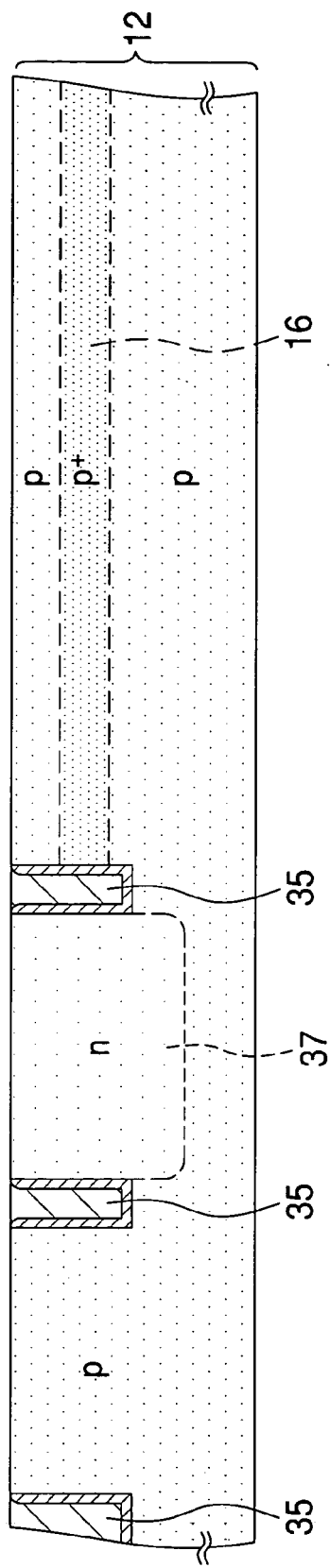
Figure 16:
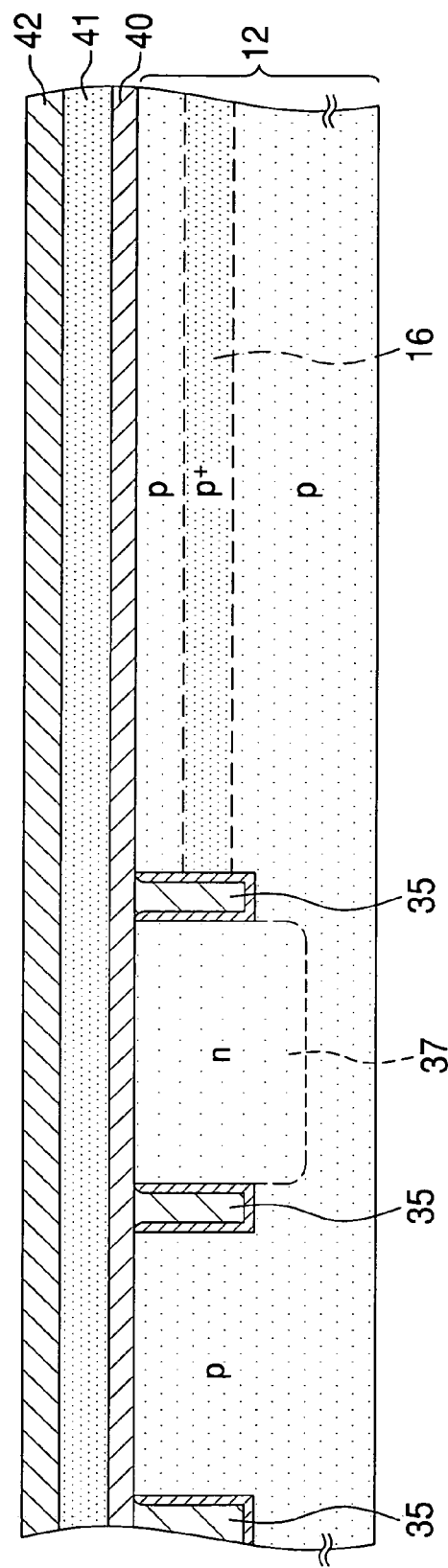

After removal of the resist mask 36 by ashing and washing the silicon substrate 12, the silicon oxide layer 30 is removed by etching, as shown in FIG. 15. Then, a silicon oxide layer 40 having the thickness of about 16 nm is formed by thermal oxidization in the exposed surface of the silicon substrate 12, as shown in FIG. 16. Moreover, a silicon nitride layer 41 having the thickness of about 50 nm, and a silicon oxide layer 42 having the thickness of about 30 nm are successively deposited on the silicon substrate 40 by CVD process.

Figure 17:
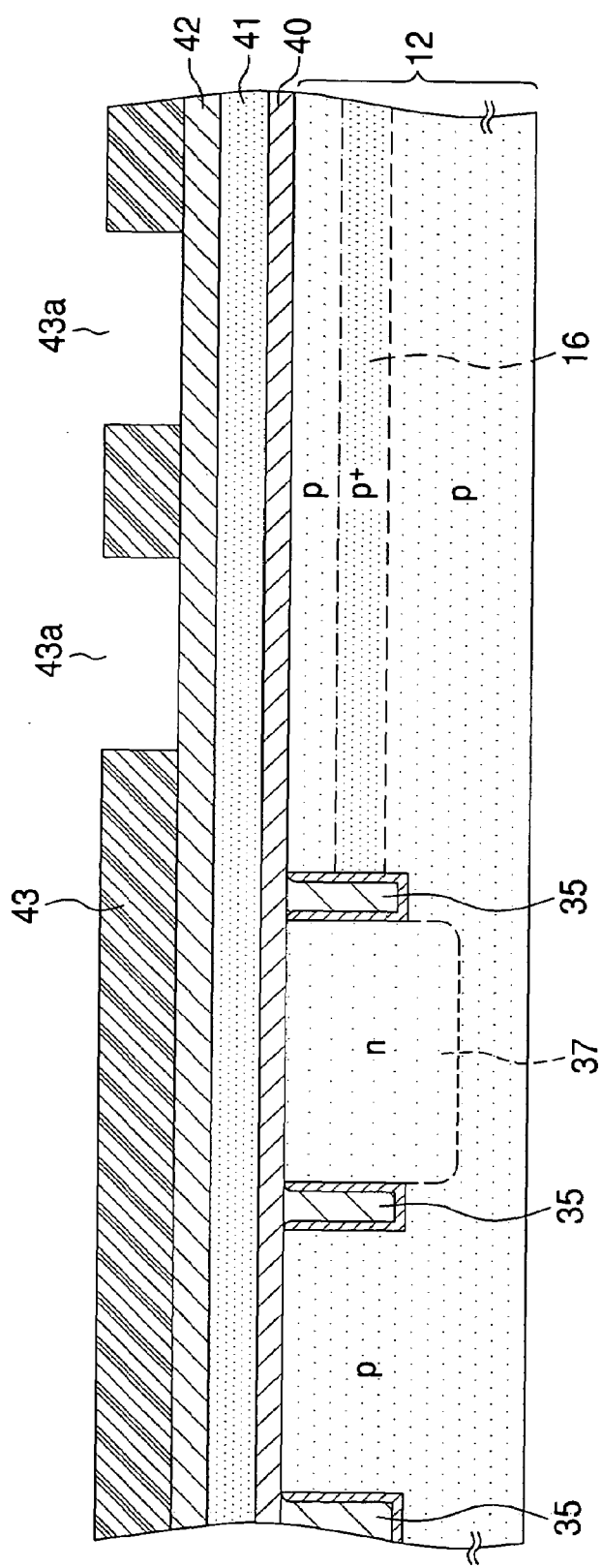

Then, the photo resist is coated on the whole surface of the silicon oxide layer 42. Then, the photo resist is subject to the exposure process through the photo mask and to the development process, so a resist mask 43 having an opening 43a in the bit line formation area is formed, as shown in FIG. 17.

Figure 48:
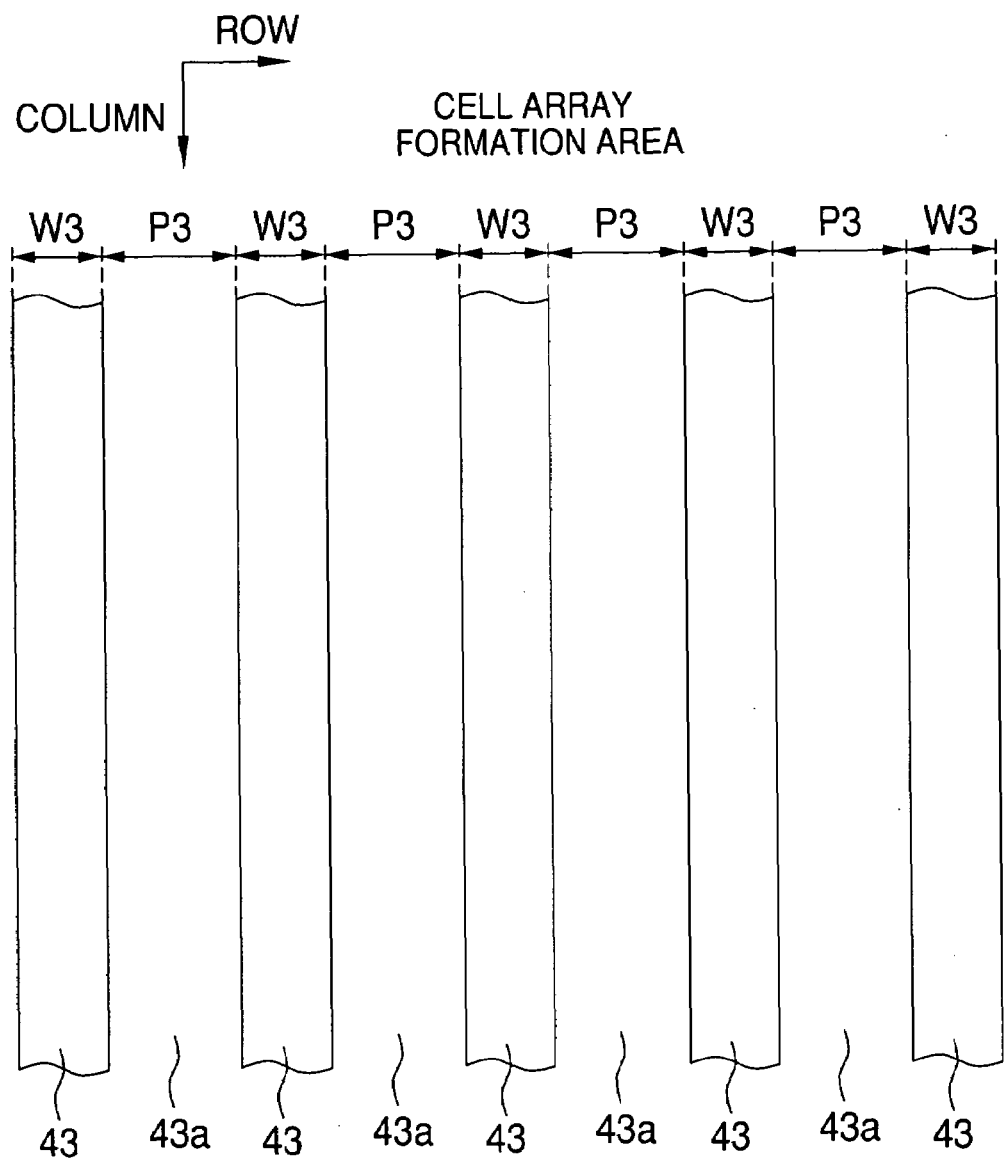
FIG. 48 is a top plan view of the cell array formation area of FIG. 17.

Referring to FIG. 48, the resist mask 43 extends in the column direction, and has the width W3 in the row direction of about 90 nm. The opening 43a extends in the column direction, and has the width P3 in the row direction of about 135 nm.

Figure 18:
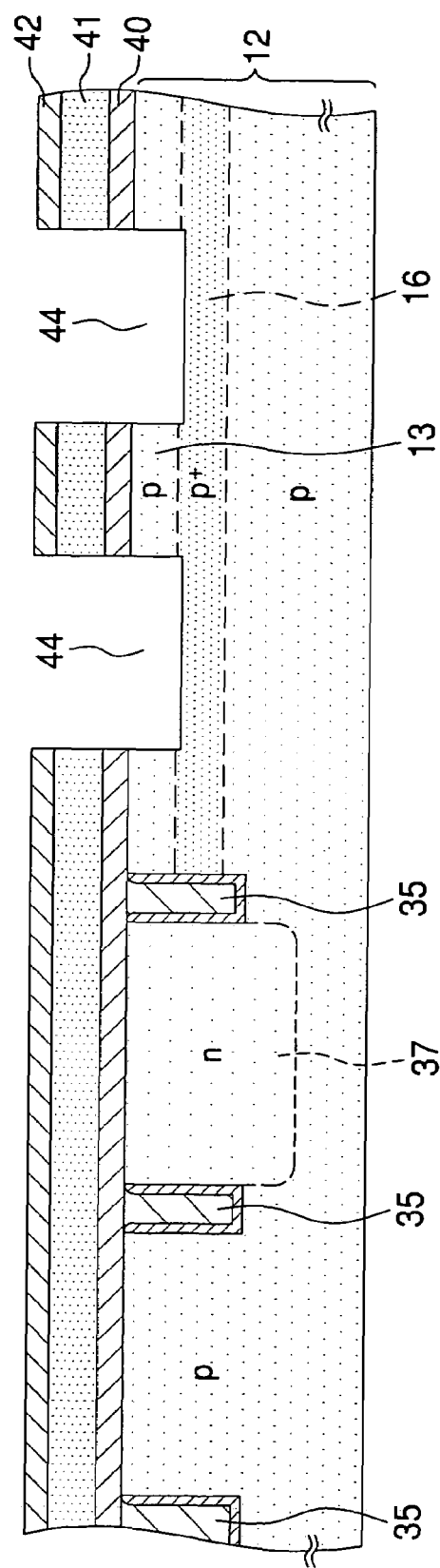

The silicon oxide layer 42 exposed through the openings 43a is etched by anisotropic etching via the resist mask 43. Then, the resist mask 43 is removed by ashing and the washing process is carried out. Then, the silicon nitride layer 41, the silicon oxide layer 40 and the silicon substrate 12 are successively subject to anisotropic etching via the patterned silicon oxide layer 42 as the hard mask, so trenches 44 are formed in the silicon substrate 12, as shown in FIG. 18. Thereby, the projection 13 extending in the column direction (the direction perpendicular to the drawing sheet) is formed in the silicon substrate 12. The depth of the trench 44 (the height of the projection 13) is about 40 nm. The width of the trench 44 depends on the width P3 of the resist mask 43, and the gap between the adjacent trenches 44 in the row direction (width of the projection 13) depends on the width W3 of the resist mask 43. In this embodiment, the width of the trench 44 is about 135 nm, and the gap between the adjacent trenches 44 is about 90 nm.

Figure 19:
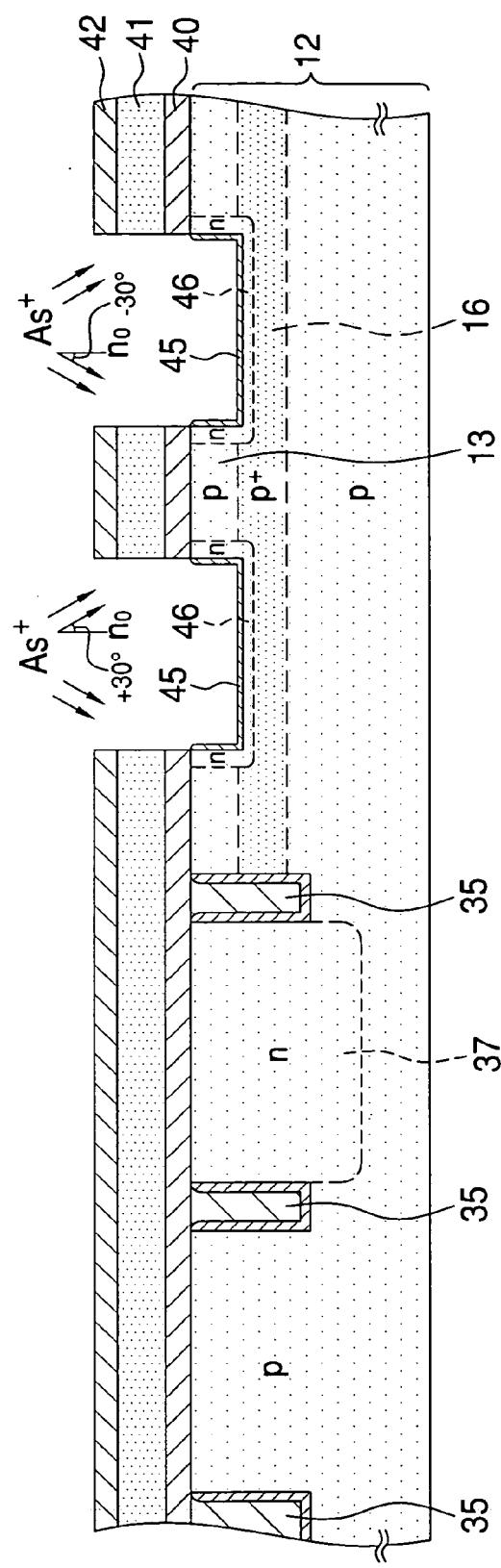

Then, thermal oxidization is carried out to form a silicon oxide layer 45 with the thickness of about 4 nm in the exposed surface of the silicon substrate 12 (the side surface and the bottom surface of the trench 44), as shown in FIG. 19. The N type impurity ions (e.g. $As^+$ ions) are implanted in the silicon substrate 12. The ion implantation direction is inclined by about ±30° to the perpendicular line $n_0$ of the silicon substrate 12, so an N type region 46 with the impurity density of about $2.0 \times 10^{12}$ $cm^{-3}$ is formed in the silicon substrate 12 (the side surface and the bottom surface of the trench 44).

Figure 20:
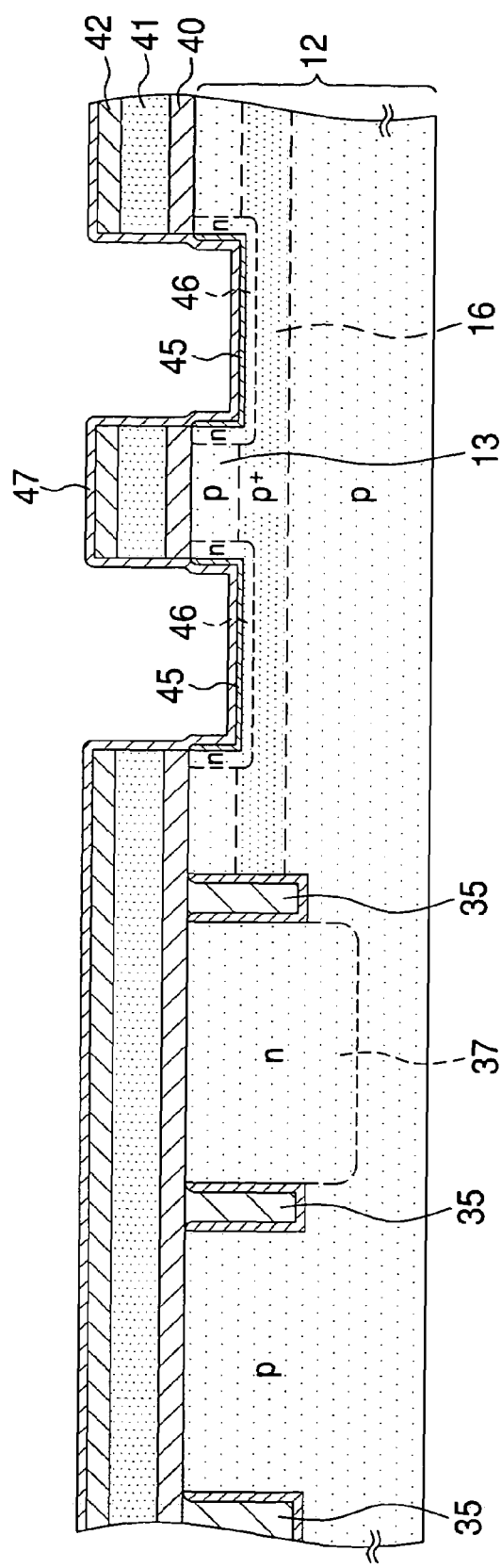
Figure 21:
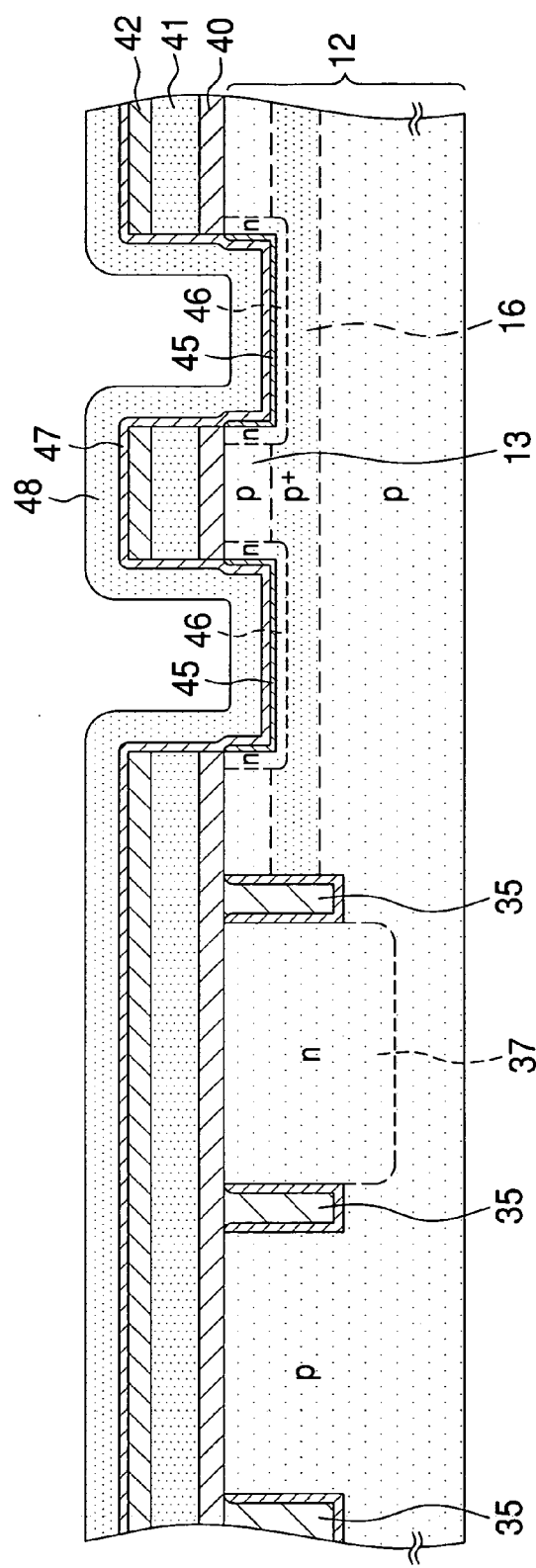
Figure 22:
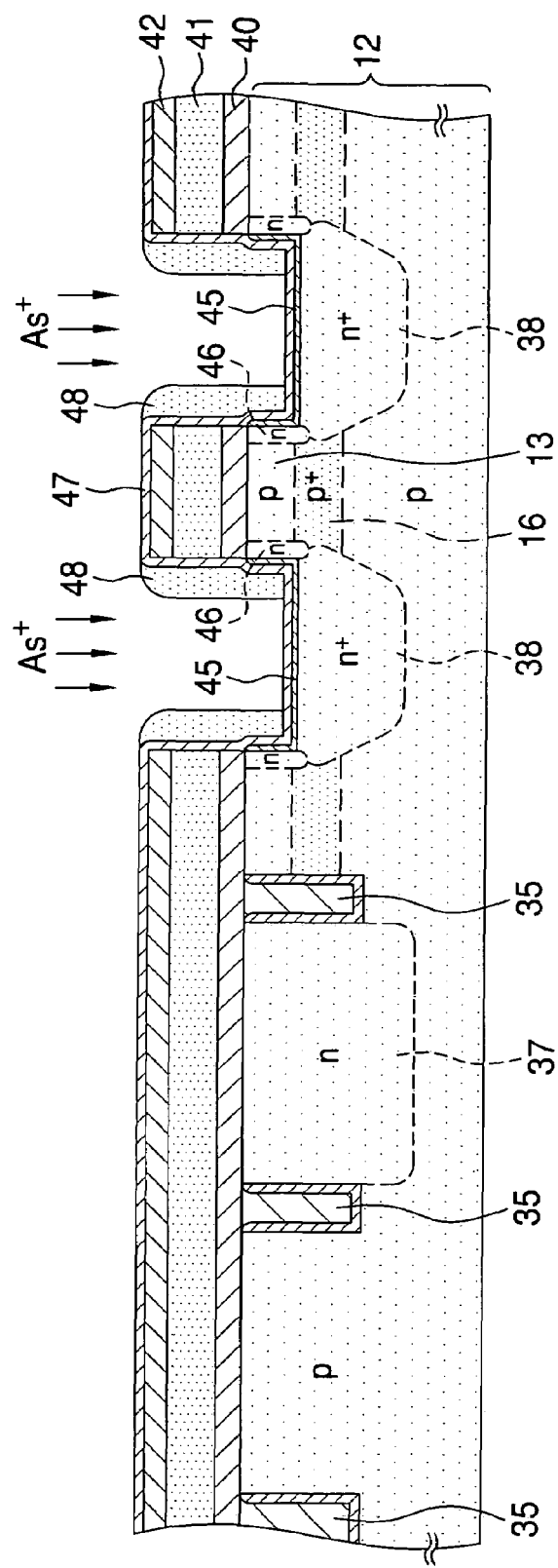

Thereafter, as shown in FIG. 20, a silicon oxide layer 47 with the thickness of about 6 nm is deposited by CVD process, and the silicon nitride layer 48 with the thickness of about 30 nm is deposited on the silicon oxide layer 47 by CVD process, as shown in FIG. 21. The silicon nitride layer 48 is subject to vertical anisotropic etching to form the side walls of the silicon nitride layer 48 on the side surfaces of the projection 13, as shown in FIG. 22. Then, N type impurity ions (e.g. $As^+$ ions) are implanted in the surface of the silicon substrate sandwiched by the side walls to form an N type diffusion region 38 with the impurity density of about $3.0 \times 10^{15}$ $cm^{-3}$. The diffusion region 38 serves as the source/drain (bit line BL) of the cell transistor 11 formed in the cell array formation area.

Figure 23:
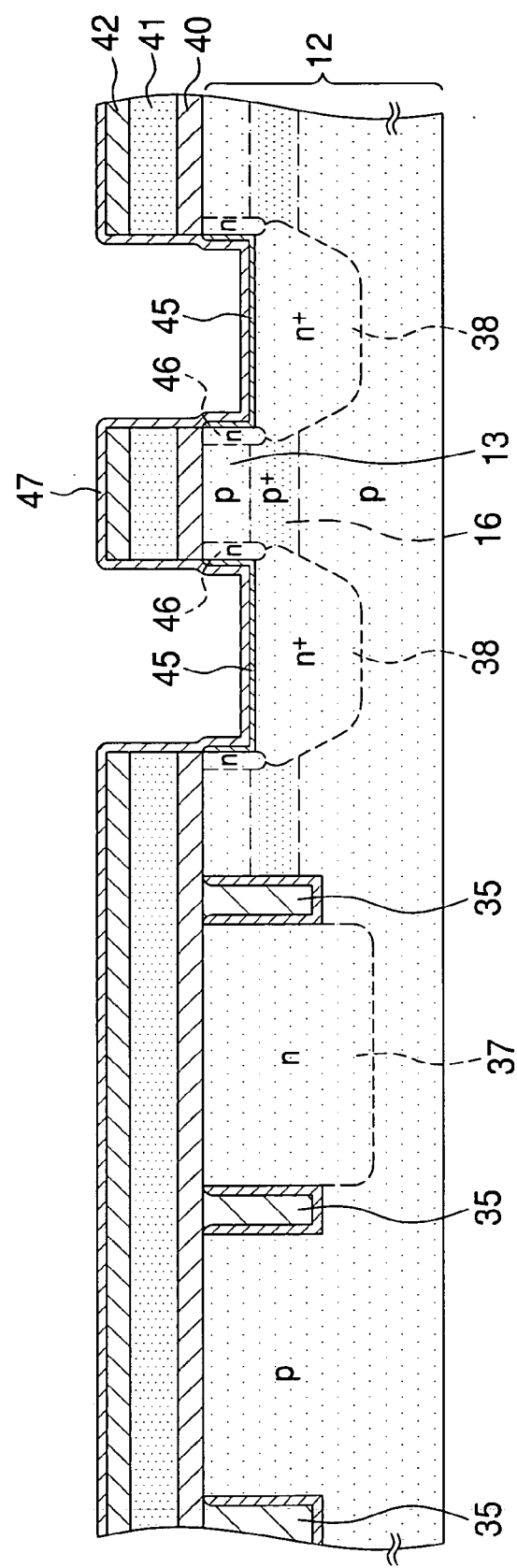
Figure 24:
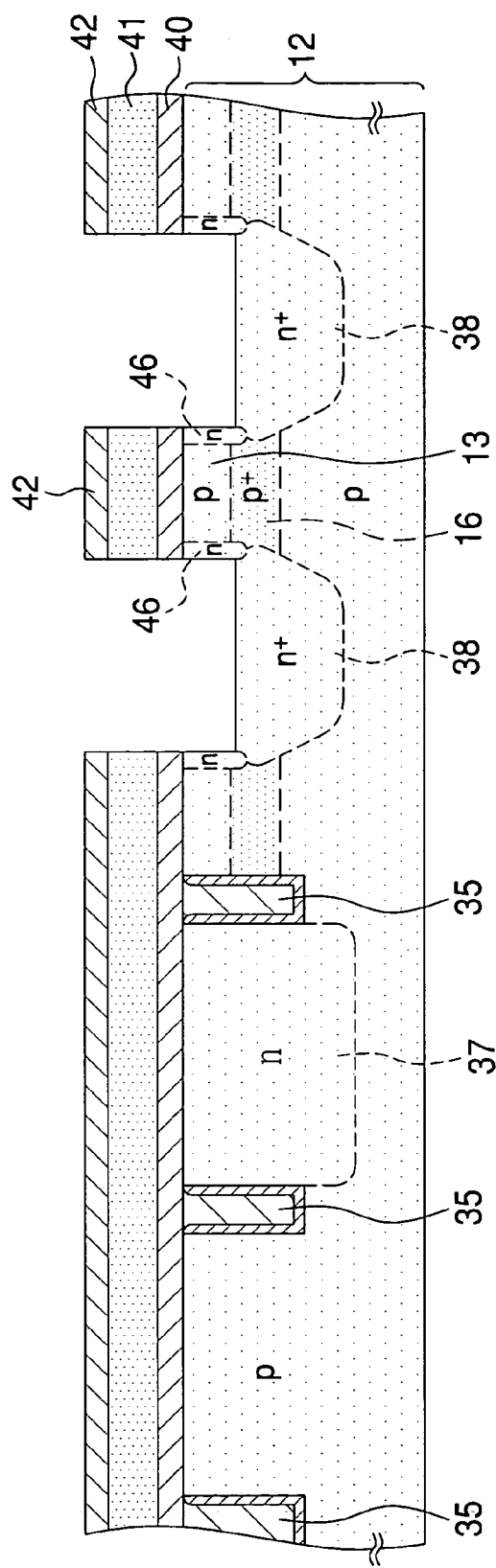

Thereafter, a thermal process called RTA (Rapid Thermal Anneal) is carried out at about 1000° C. for about 10 seconds to activate the impurities injected by the ion implantation. Referring to FIG. 23, the silicon nitride layer 48 is removed by etching process, and the thermal process is carried out at about 850° C. for about 60 seconds. Then, as shown in FIG. 24, the silicon oxide layers 45, 47 are completely removed by the etching process.

Figure 25:
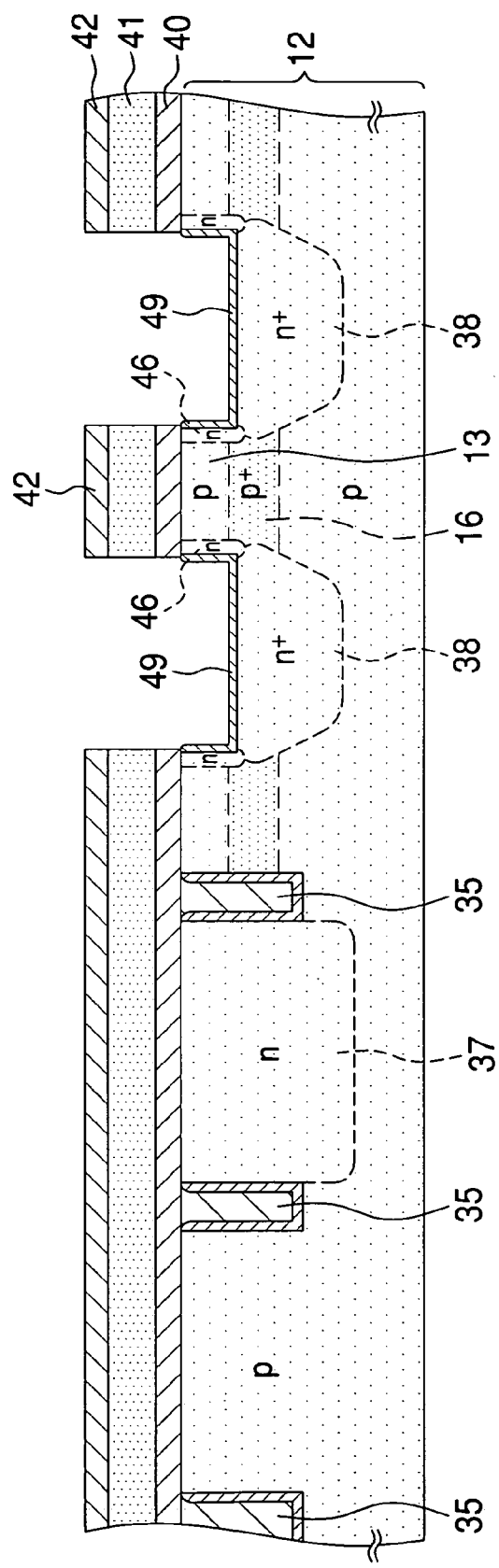

Referring to FIG. 25, a silicon oxide layer 50 having uniform thickness of about 8 nm is formed in the exposed surface of the exposed silicon substrate 12 (surface of the diffusion region 38 and the side surfaces of the projection 13) by a plasma oxidization (to oxidize silicon by use of oxygen radicals ($O^*$)). In the plasma oxidization process, the silicon oxide layer 49 is formed by eroding the silicon substrate 12 inward by about 3 nm, and by swelling outward by about 5 nm.

Figure 26:
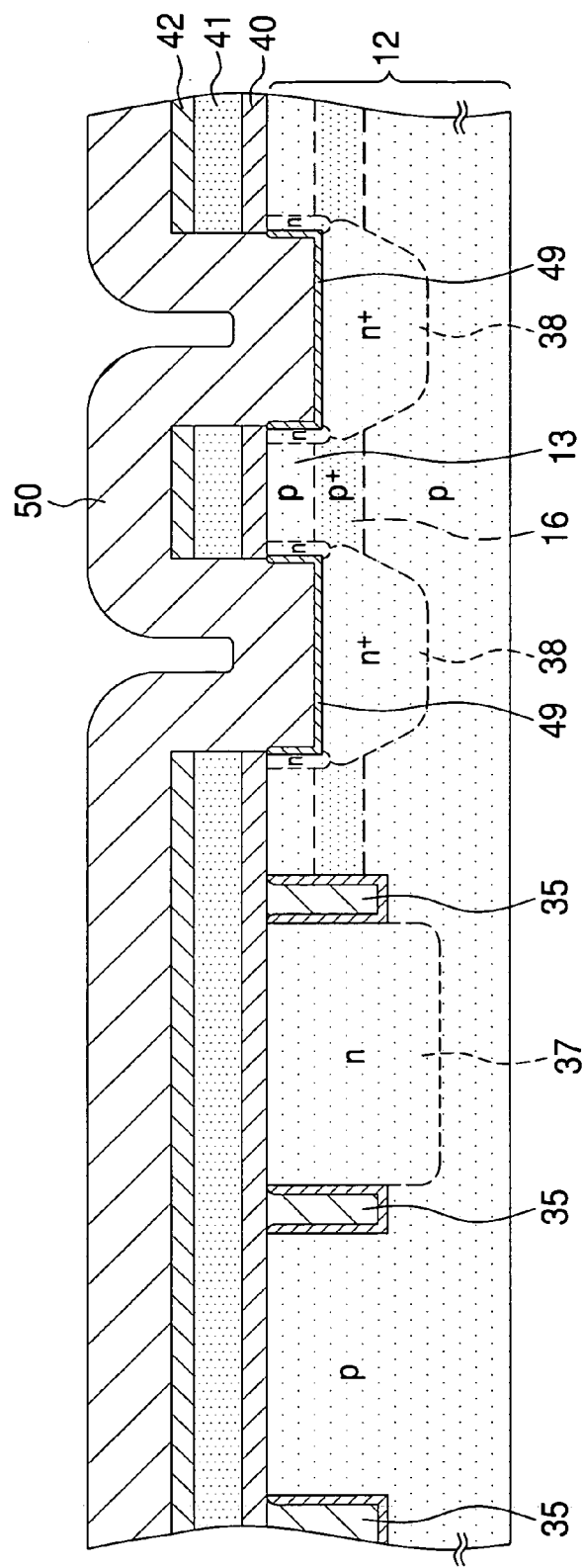
Figure 27:
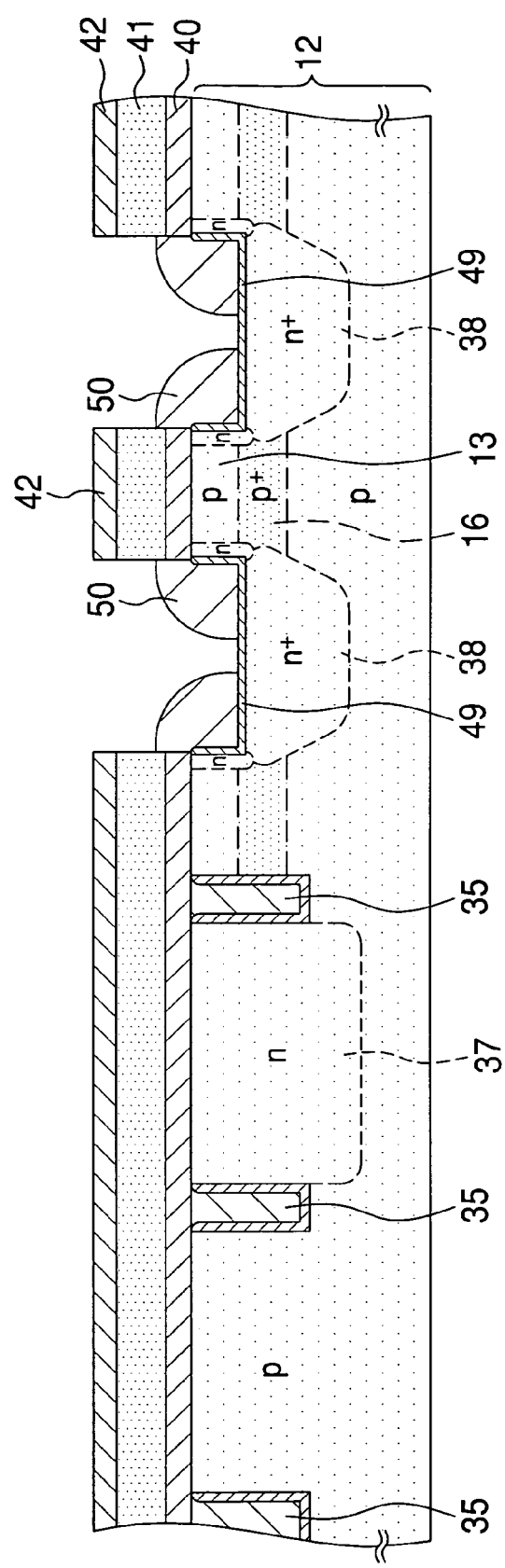
Figure 49:
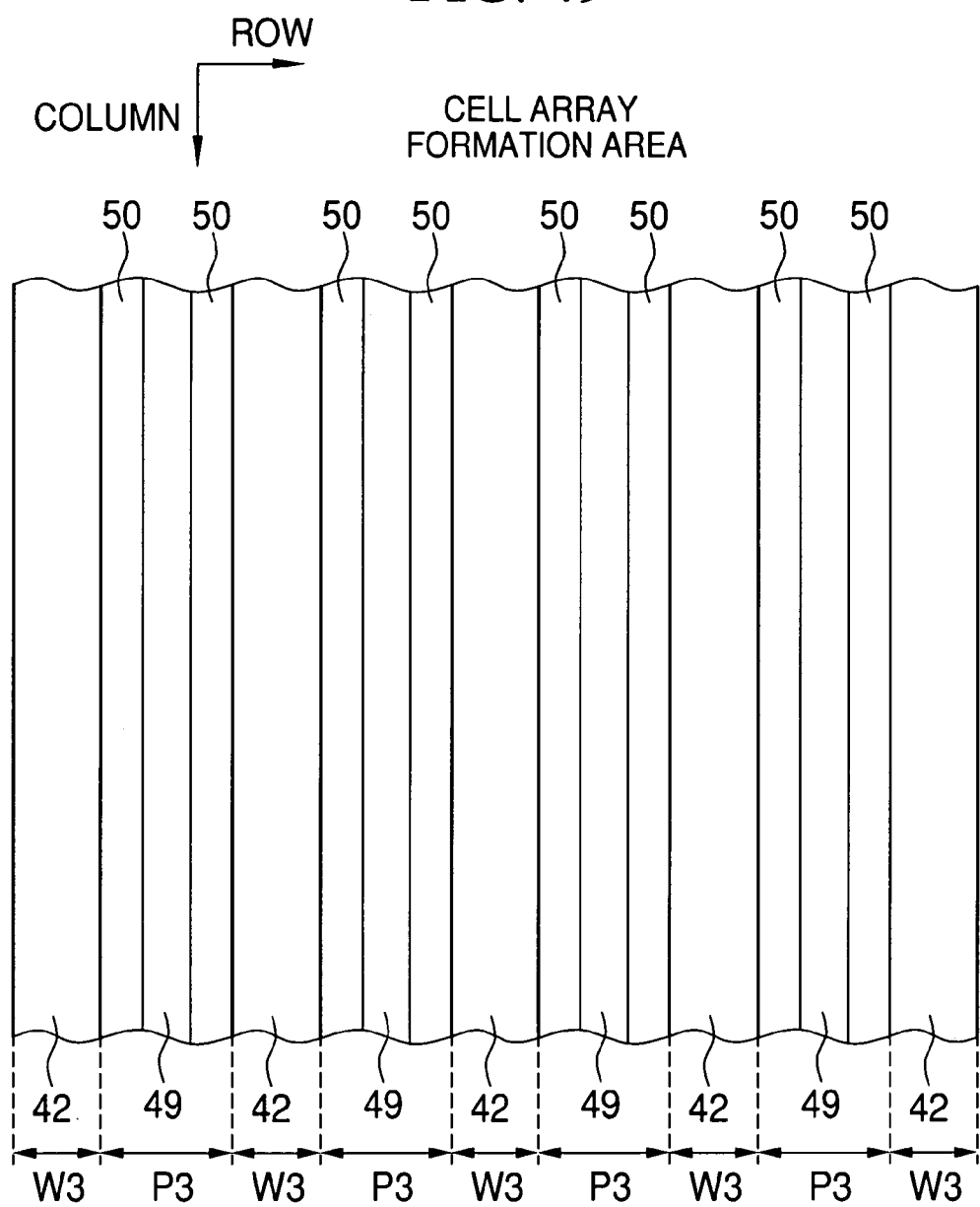
FIG. 49 is a top plan view of the cell array formation area of FIG. 27.

Referring to FIG. 26, a conductive silicon (amorphous silicon or poly silicon) 50 for the floating gate is deposited on the whole surface by the CVD process. The thickness of the conductive silicon 50 is about 50 nm. Then, as shown in FIG. 27, the conductive silicon 50 is subject to anisotropic etching process in the vertical direction, so the silicon oxide layer 42 is exposed and the silicon oxide layer 49 on the surface of the diffusion region 38 is partially exposed. As a result, the conductive silicon 50 is divided in the row direction. This anisotropic etching process makes the upper end of the remaining conductive silicon 50 lower than the top surface of the silicon nitride layer 41 and higher than the bottom surface of the silicon nitride layer 41. The divided conductive silicon 50 remains in both sides of the projection 13, and extends in the column direction, as shown in FIG. 49.

Figure 50:
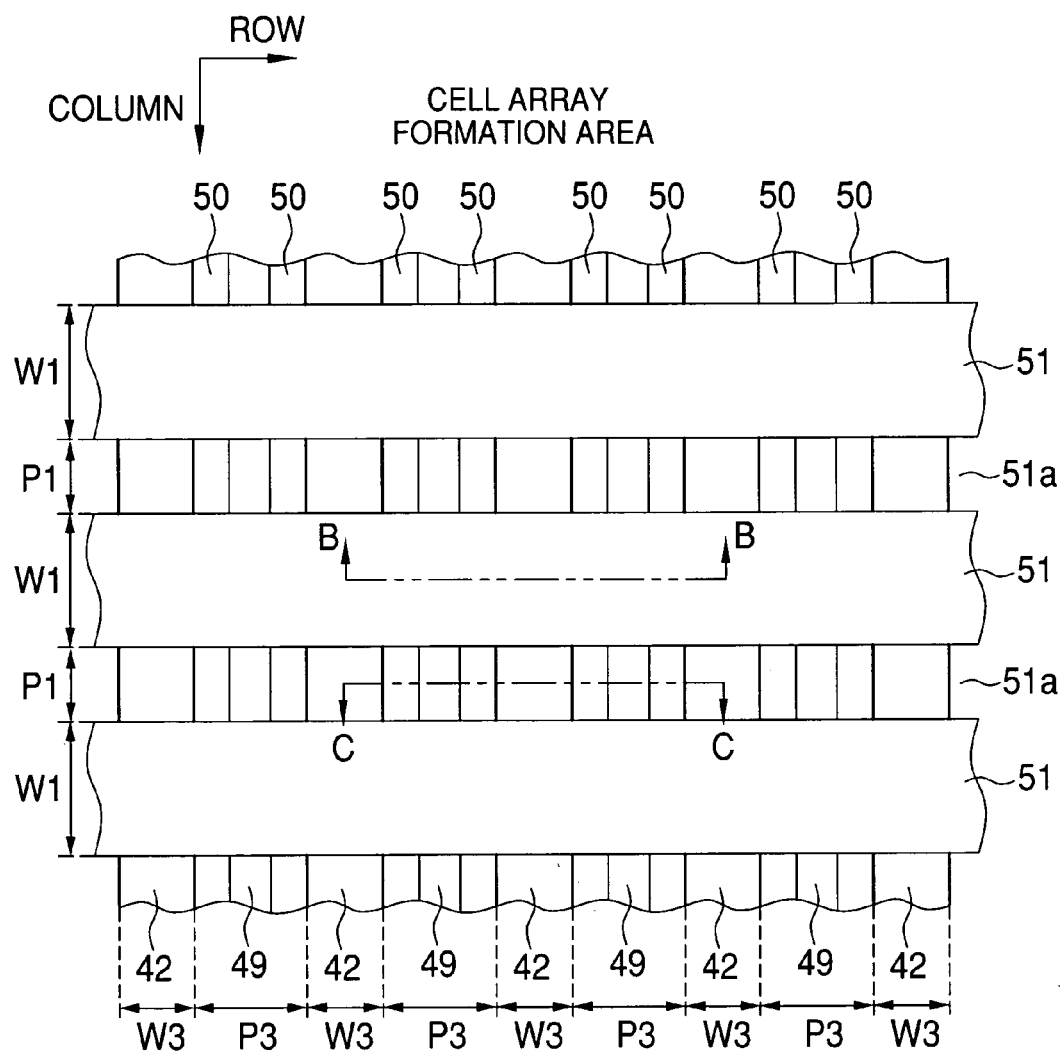
FIG. 50 is a top plan view of the cell array formation area of FIG. 28.

Then, the photo resist is coated on the whole surface, and the photo resist is subject to the exposure process through the photo mask and the development process, so a resist mask 51 having an opening 51a in the cell array formation area is formed, as shown in FIG. 50. The resist mask 51 in the cell array formation area extends in the row direction, and has the width W1 in the column direction of about 162 nm. The opening 51a extends in the row direction, and has the width P1 in the column direction of about 90 nm.

The cell array formation area of FIG. 28A is the section taken on line B-B (word line formation area) of FIG. 50, and the cell array formation area of FIG. 28B is the section taken on line C-C (word line separation area) of FIG. 50. In the following description, the cell array formation area shown in FIGS. 29A, 30A, 31A, 32A, 33A, 34A, 35A and 36A is the section taken on line B-B, and the cell array formation area shown in FIGS. 29B, 30B, 31B, 32B, 33B, 34B, 35B and 36B is the section taken on line C-C.

Figure 29A:
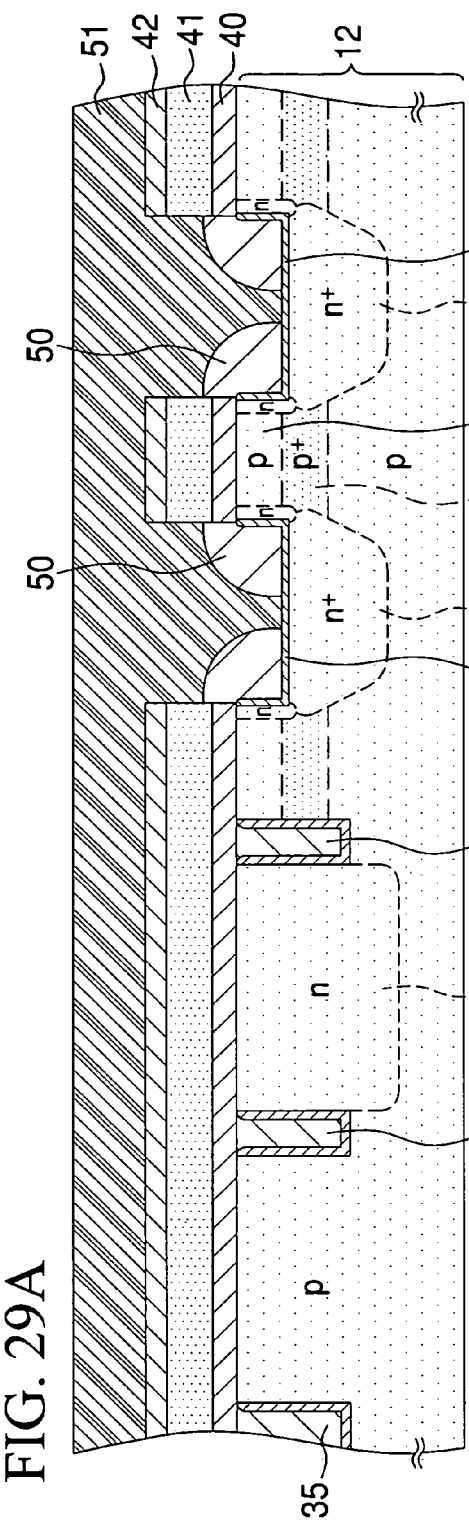
Figure 29B:
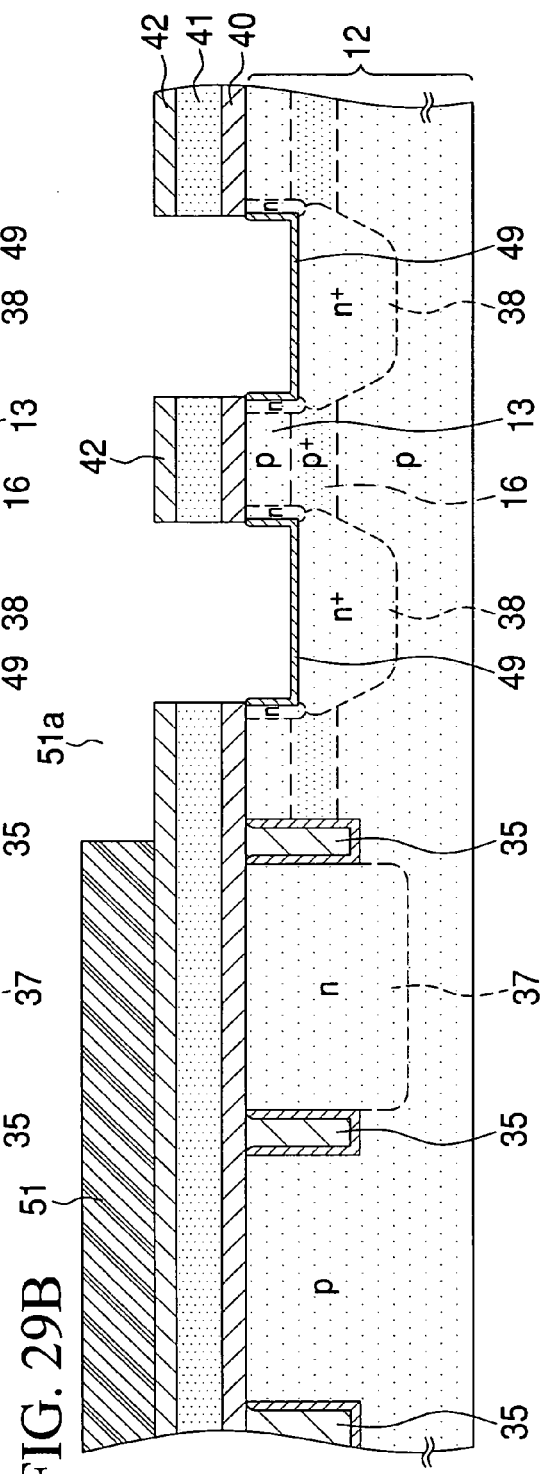
Figure 51:
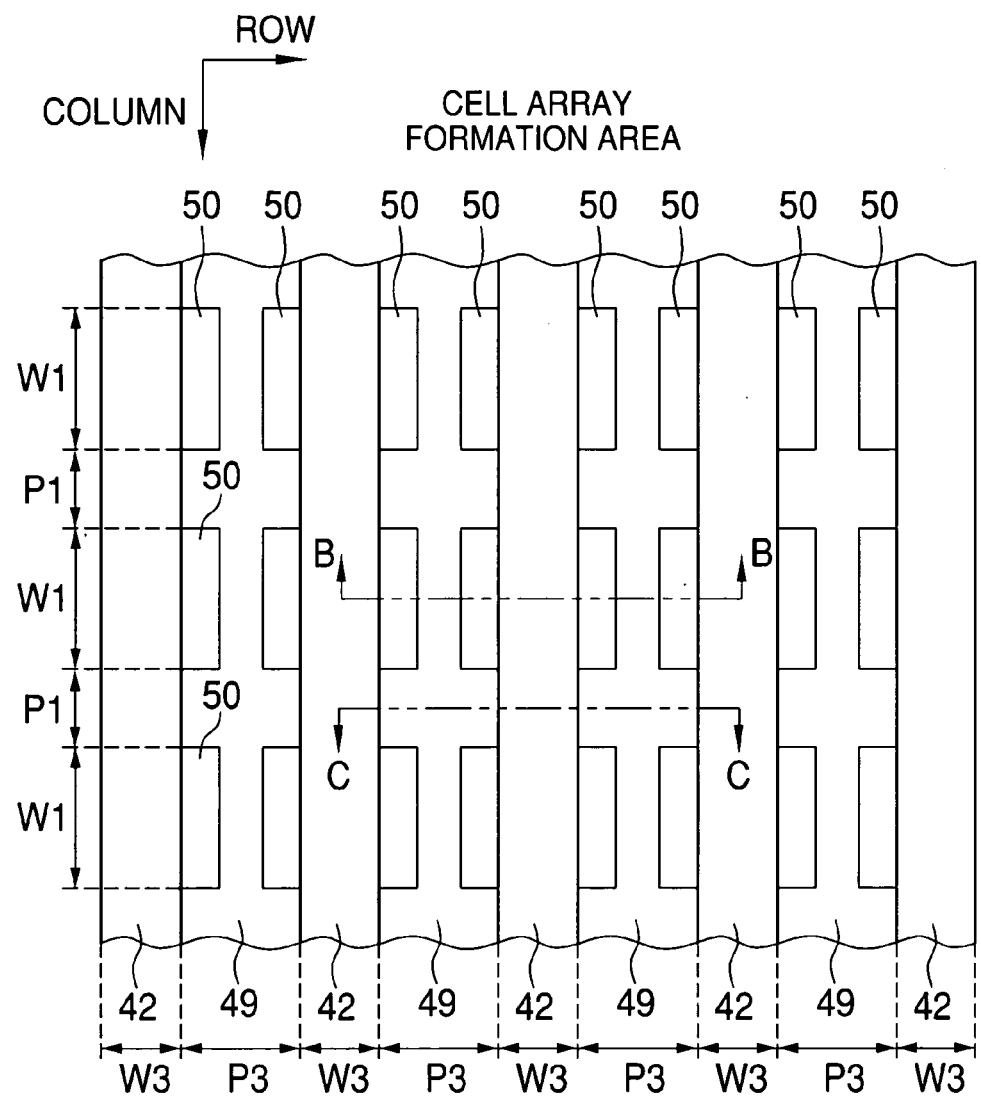
FIG. 51 is a top plan view of the cell array formation area of FIG. 29.

Thereafter, the conductive silicon 50 exposed in the opening 51 is removed by etching process through the resist mask 51, so the conductive silicon 50 is divided in the column direction (see FIG. 29B). The resist mask 51 is removed by ashing process, and then the washing process is carried out. Referring to FIG. 51, the width of the divided conductive silicon 50 in the column direction depends on the width W1 of the resist mask 51, and the gap between the adjacent conductive silicon 50 depends on the width P1 of the opening 51a. In this embodiment, the width of the conductive silicon 50 is about 162 nm, and the gap between the adjacent conductive silicon 50 is about 90 nm. The divided conductive silicon 50 is the floating gate of the cell transistor 11.

Figures 31A, 31B:
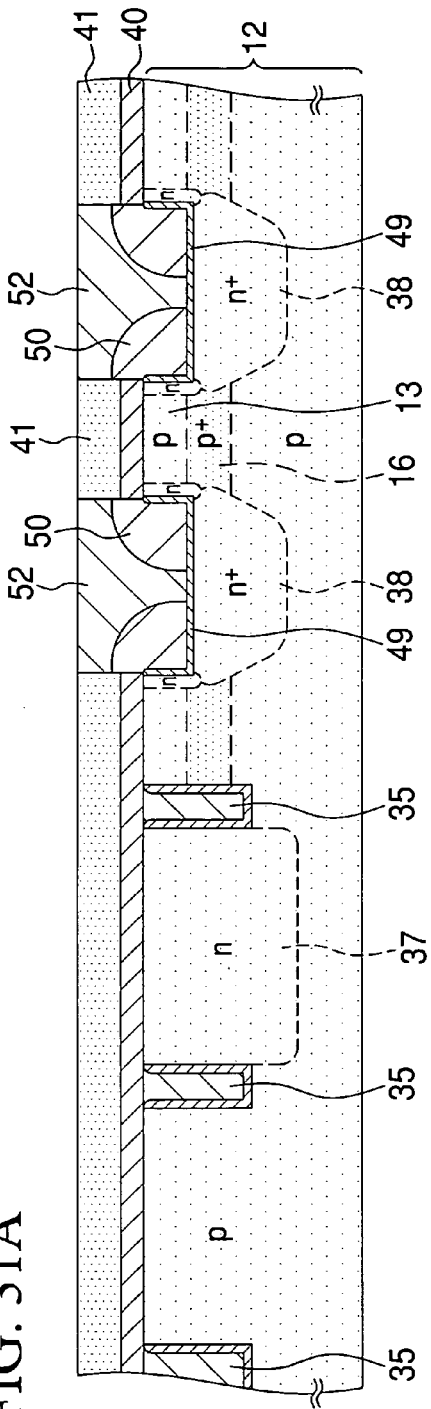

Then, in FIGS. 30A, 30B, a high density plasma (HDP) oxide layer 52 with the thickness of about 100 nm is formed over the surface by the CVD process. In FIGS. 31A, 31B, the HDP oxide layer 52 is subject to CMP (Chemical Mechanical Polishing) process to flatten the surface of the HDP oxide layer 52. This CMP process is carried out until the silicon nitride layer 41 is exposed. Referring to FIGS. 32A, 32B, the silicon nitride layer 41 as the stopper in the CMP process is removed by the etching process, so the part of the side surfaces (upper part of the side surfaces) of the conductive silicon 50 in the projection 13 side are exposed.

Figures 33A, 33B:
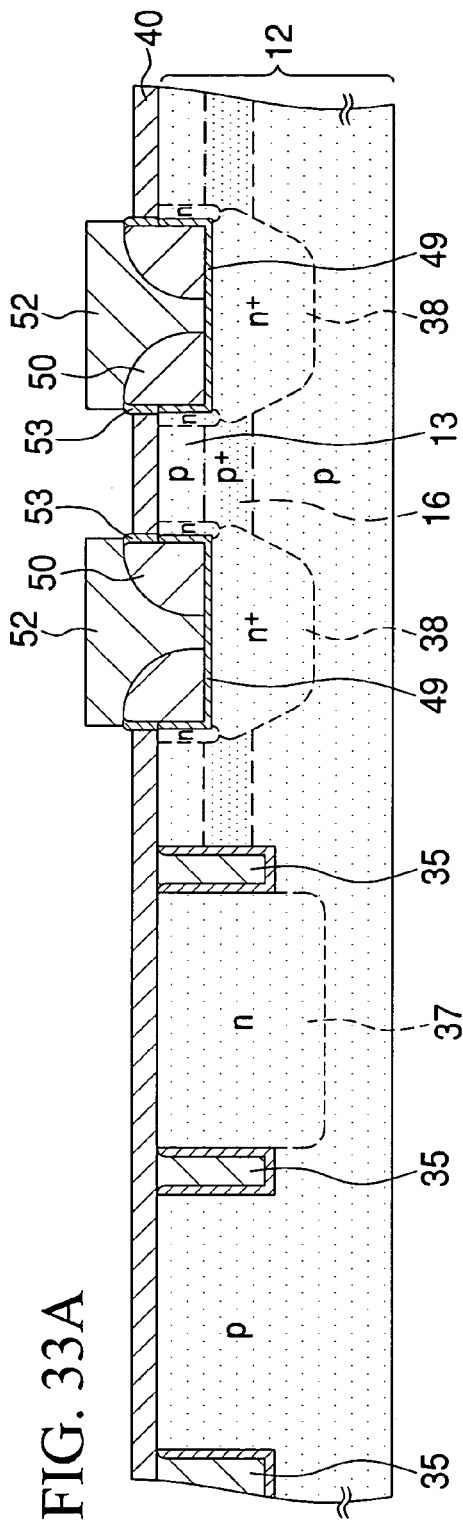
Figure 36A:
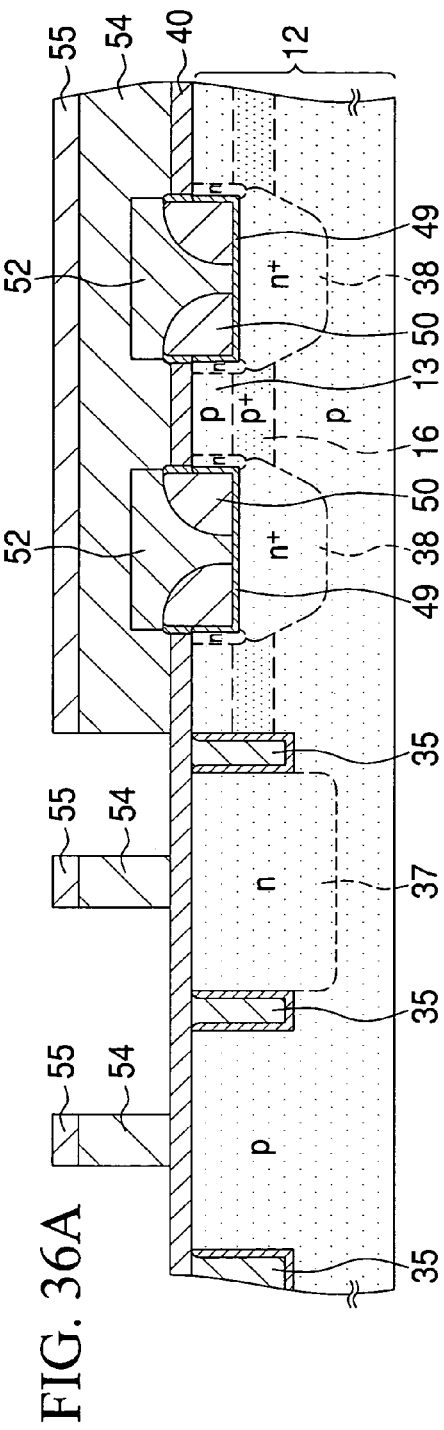
Figure 36B:
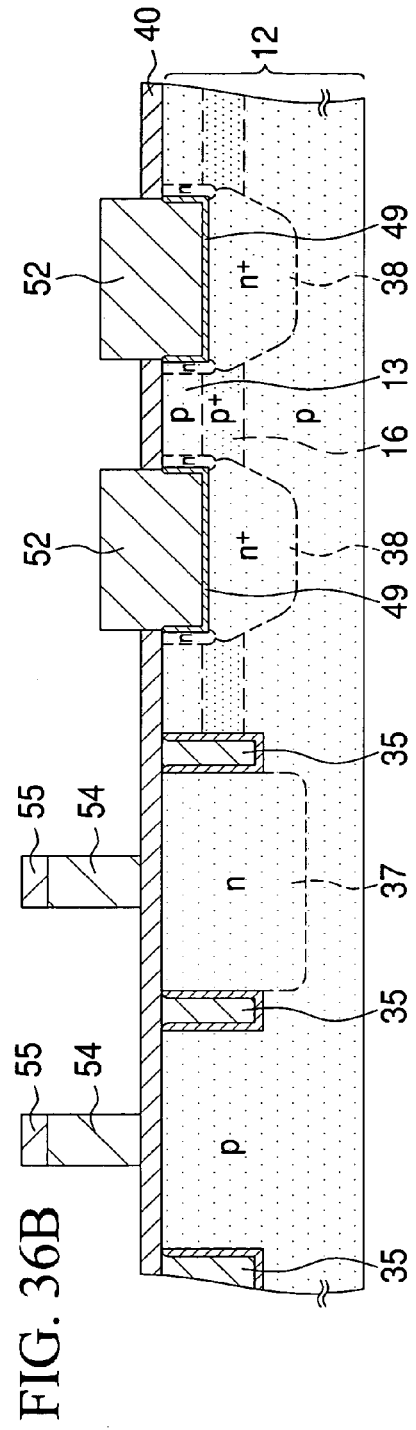

In FIG. 33A, the plasma oxidization (radical oxidization) process is performed to form a silicon oxide layer 53 in the exposed side surfaces of the conductive silicon 50. The thickness of the silicon oxide layer 53 is about 14 nm. The portion of the sides of the conductive silicon 50 covered with the silicon oxide layer 40 is also oxidized at the same time. Due to this plasma oxidization process, the corner of the conductive silicon 50 becomes slightly round. The plasma nitridation (radical nitridation) process may be carried out to get the surfaces of the oxide layers 40, 52, 53 shallowly nitrified for the purpose of reducing current leakage.

Referring to FIGS. 34A, 34B, a conductive silicon 44 (amorphous silicon or poly silicon) 54 for control gate formation is deposited over the whole surface by the CVD process. Then, the CMP process is carried out to flatten the surface of the layered conductive silicon 54. Then, a silicon oxide layer 55 is formed on the conductive silicon 54 by the CVD process. Instead of the silicon oxide layer 55, a silicon nitride layer may be formed.

Figure 52:
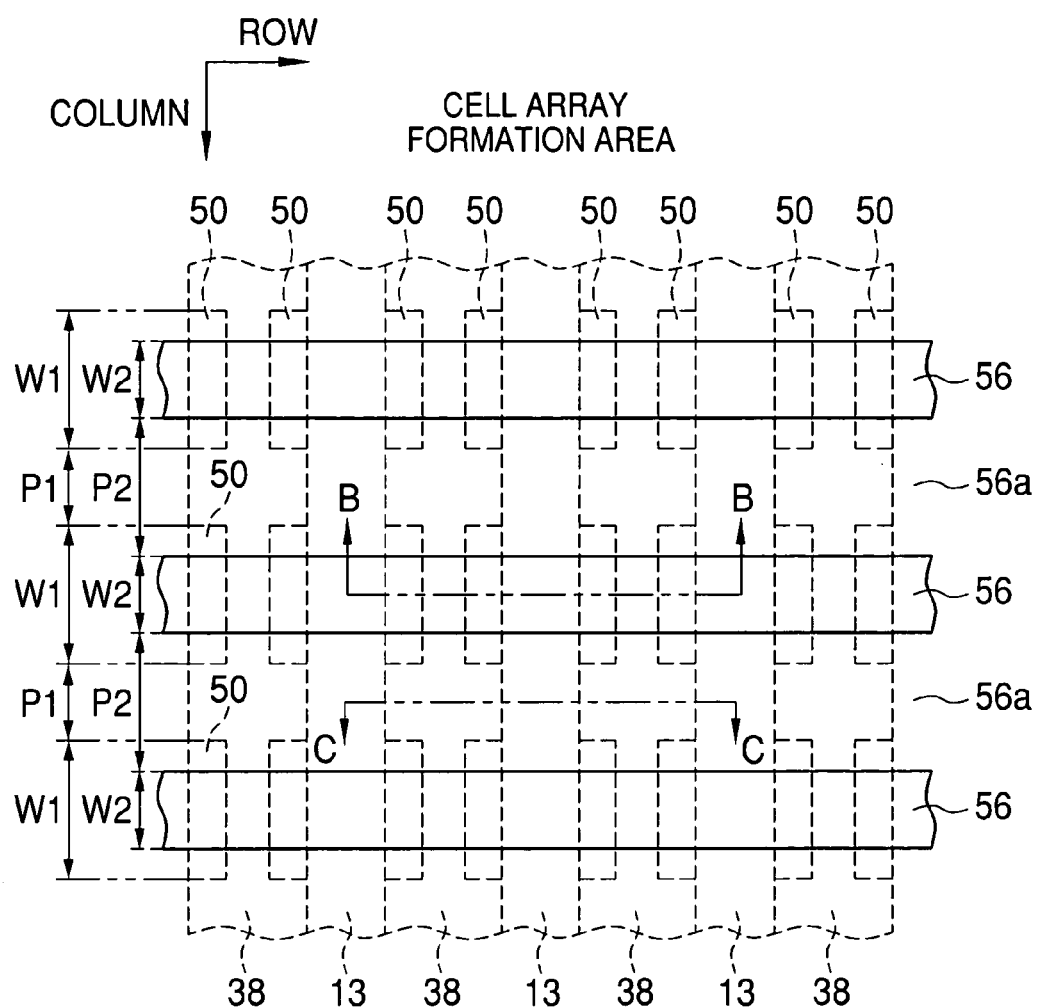
FIG. 52 is a top plan view of the cell array formation area of FIG. 36.

Thereafter, a photo resist is coated on the silicon oxide layer 55, and pattern exposure to the photo resist through the predetermined photo mask and development processes are carried out to form a resist mask 56 in which the photo resist remains in the gate formation area of the CMOS (P type MOS transistor and N type MOS transistor), the cell array formation area and the word line formation area, as shown in FIGS. 35A, 35B. Referring to FIG. 52, the stripe-shaped resist mask 56 in the cell array formation area extends in the row direction, and the width W2 of the resist mask 56 in the column direction is about 90 nm. The opening formed between the resist masks 56 extends in the row direction, and the width P2 of the opening is about 162 nm. The resist mask 56 in the cell array formation area exists above the conductive silicon 50 with respect to the column direction.

The width W2 of the resist mask 56 is smaller than the width W1 of the conductive silicon 50, so the conductive silicon 50 is projected in the column direction from both sides of the resist mask 56 by the same length ((W1−W2)/2=36 nm). The permissible error in the position of the resist mask 56 is 36 nm in the column direction that is equal to 40% in the event of 90 nm minimum design rule. The cell array formation area in FIG. 35A corresponds to the section taken on line B-B of FIG. 52, the cell array formation are in FIG. 35B corresponds to the section taken on line C-C of FIG. 52B.

The silicon oxide layer 55 in the opening 56a (the CMOS transistor formation area except the gate formation area, and the word line separation area in the cell array formation area) is removed by the etching process via the resist mask 56, so the silicon oxide layer 55 pattern is formed. Then, the resist mask 56 is removed by the ashing process, and the washing process is carried out. The etching process through the silicon oxide 55 as the hard mask is carried out to remove the conductive silicon 54 in the CMOS transistor formation area except the gate formation area, and in the word line separation area in the cell array formation area. Thereby, the conductive silicon 54 remained in the CMOS transistor formation area is the gate of the CMOS transistor, and the conductive silicon 54 divided in the column direction in the cell array formation area is the word line (control gate).

Figure 37:
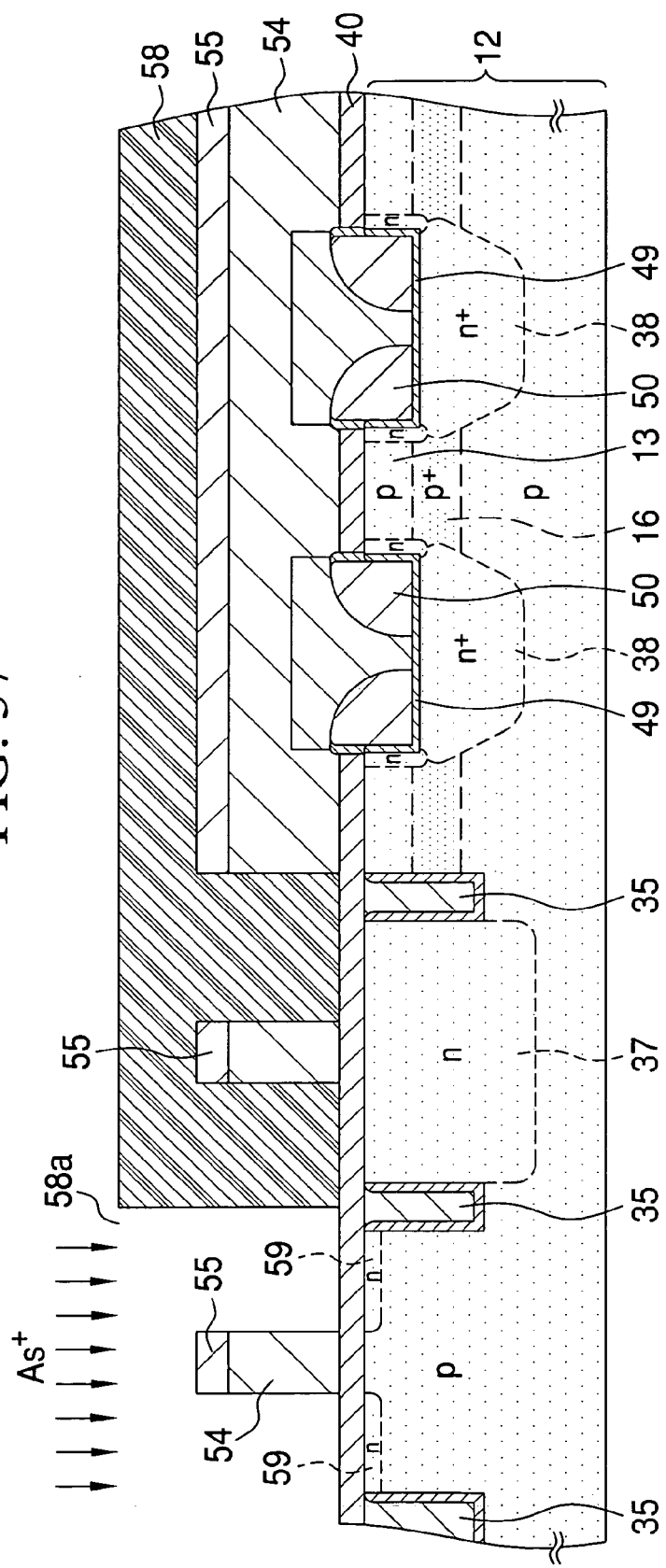

The cell array formation area in FIGS. 39 through 47 shows the section taken on line A-A of FIG. 1. After formation of the word line by dividing the conductive silicon 54 in the cell array formation area, the photo resist is coated on the whole surface. The exposure process through a predetermined photo mask and the development process are carried out to form a resist mask 58 having openings 58a in the N type MOS transistor formation area, as shown in FIG. 37. Then, the N type impurity ions (e.g. As$^+$ ions) are implanted in the surface of the silicon substrate 12 that is not covered with the resist mask 58, so a shallow N type region 59 with low impurity density is formed in the surface of the P type silicon substrate 12.

Figure 38:
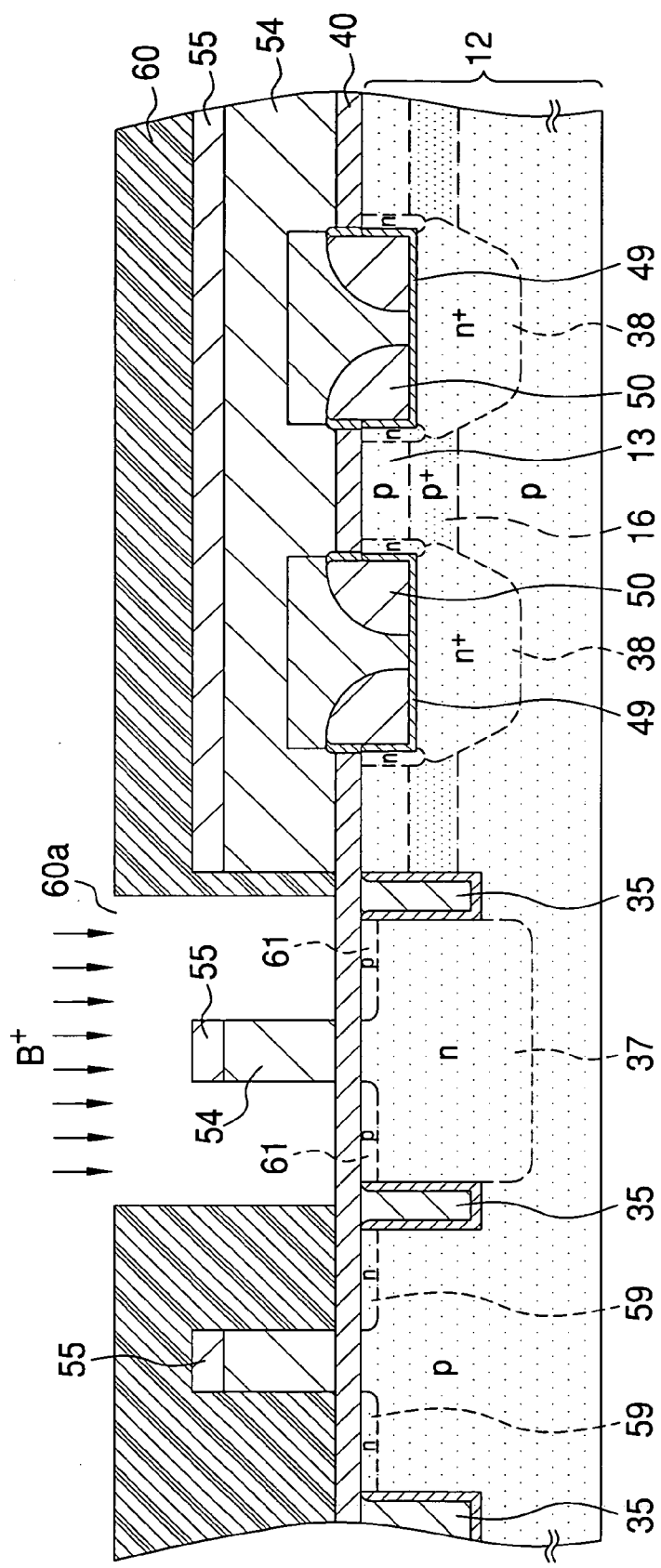

After removal of the resist mask 58 by the ashing process and the washing process, the photo resist is coated on the whole surface. The photo resist is subject to the exposure process through the photo mask and the development process, so a resist mask 60 having an opening 60a in P type MOS transistor formation area is formed, as shown in FIG. 38. Then, P type impurity ions (e.g. B$^+$ ions) are implanted through the opening 60a of the resist mask 60, so a shallow P type region 61 with a low impurity density is formed in the surface of the N type well region 37.

Figure 39:
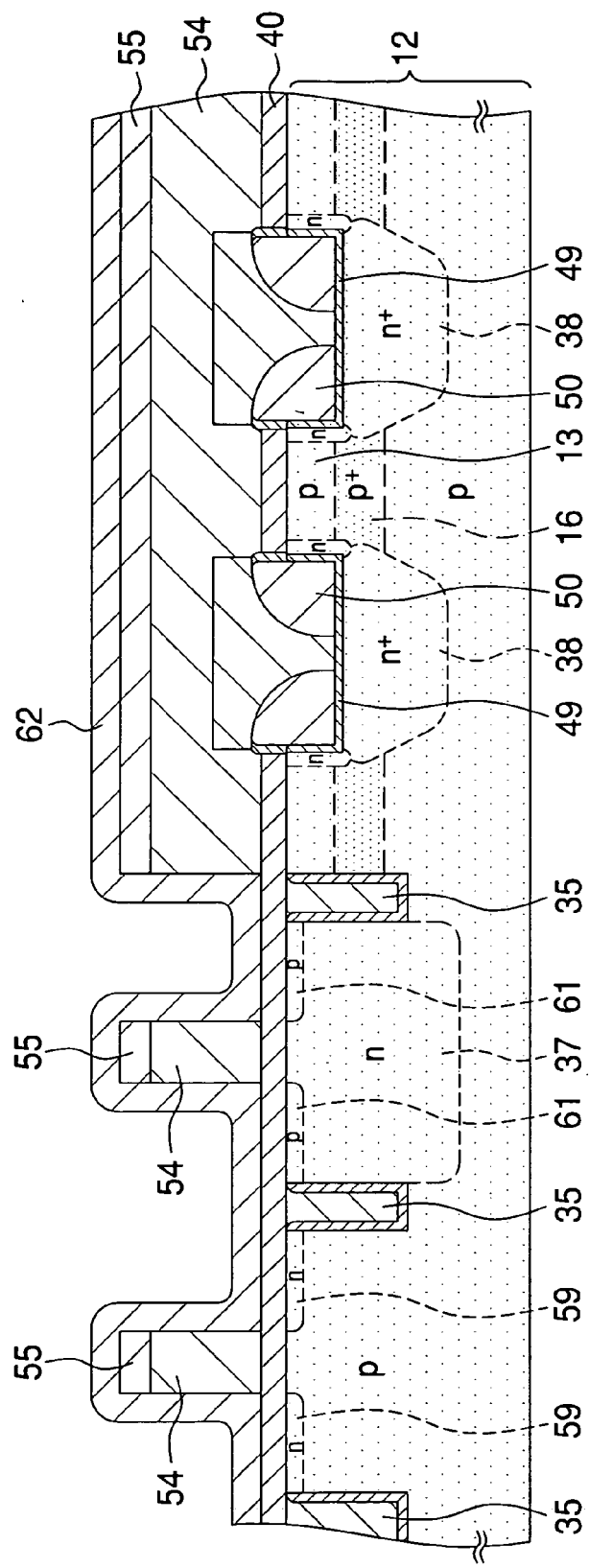
Figure 40:
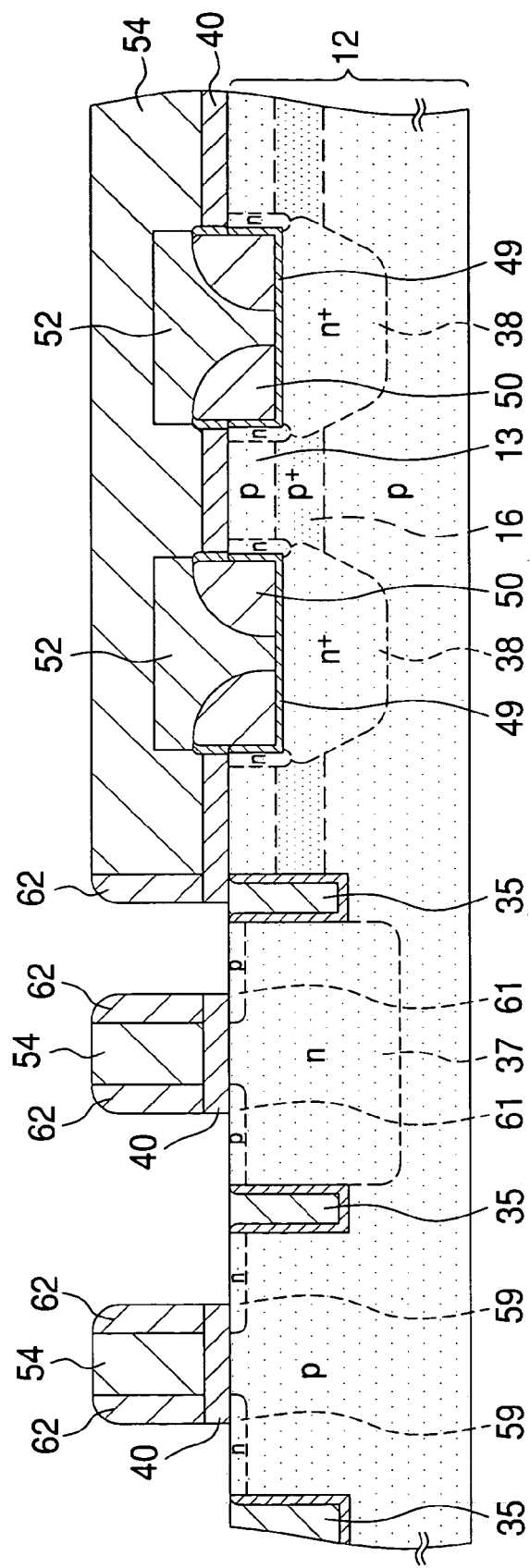

After removal of the resist mask 60 by the ashing process and the washing process, a silicon oxide layer 62 is formed on the whole surface, as shown in FIG. 39. Then, as shown in FIG. 40, the silicon oxide layers 62, 55 are subject to anisotropic etching process so that the silicon oxide layer 62 as the side wall remains on the side surface of the conductive silicon 54 in the CMOS transistor formation area. During anisotropic etching, the silicon oxide layer 40 in the CMOS transistor formation area is also etched, so the N type region 59 and the P type region 61 are partially exposed. The silicon oxide layer 40 remaining below the conductive silicon 54 is the gate insulation layer of the CMOS transistor (N type MOS transistor and P type MOS transistor).

Figure 41:
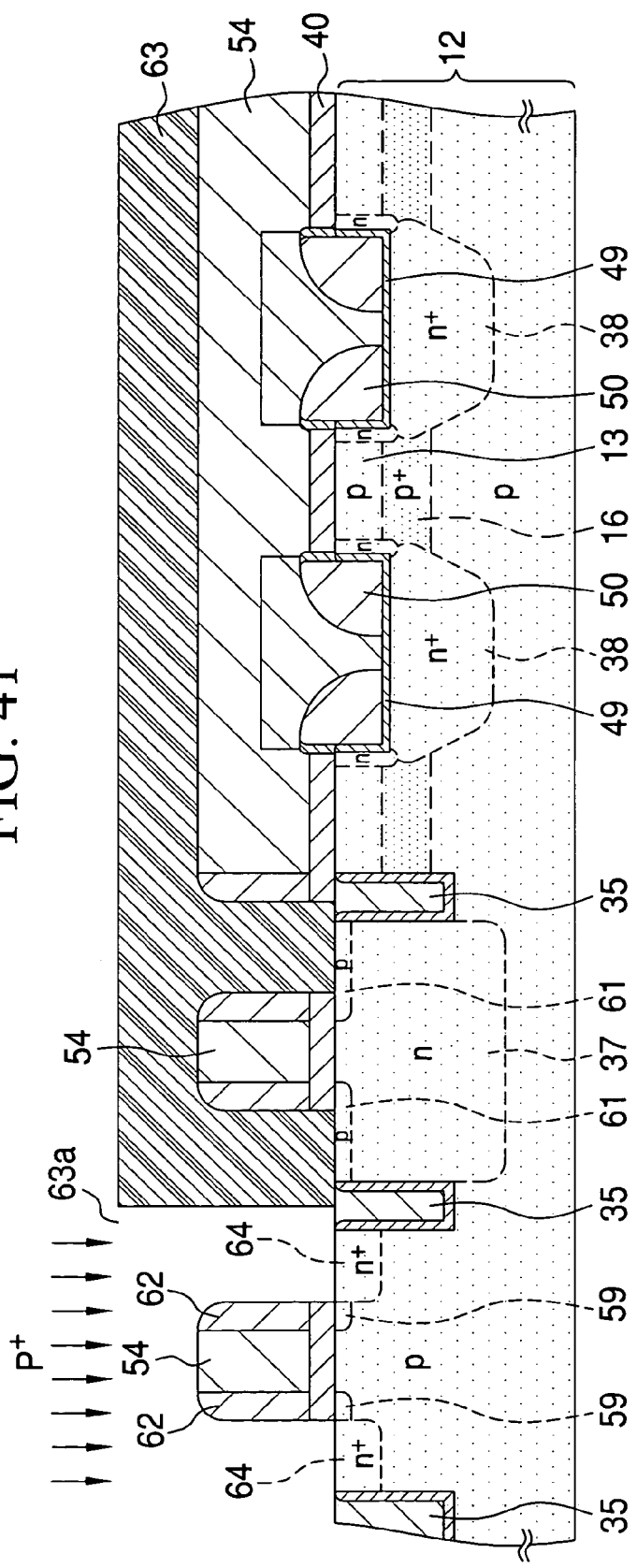

Then, the photo resist is coated on the whole surface, and the photo resist is subject to the exposure process through the photo mask and the development process, so a resist mask 63 having an opening 63a in N type MOS transistor formation area is formed, as shown in FIG. 41. Then, N type impurity ions (e.g. P$^+$ ions) are implanted via the resist mask 63, so an N type diffusion region 64 with a high impurity density is formed in the surface of the silicon substrate 12. The N type diffusion region 64, formed in the area deeper than the N type area 59, constitutes the source/drain of the N type MOS transistor.

Figure 42:
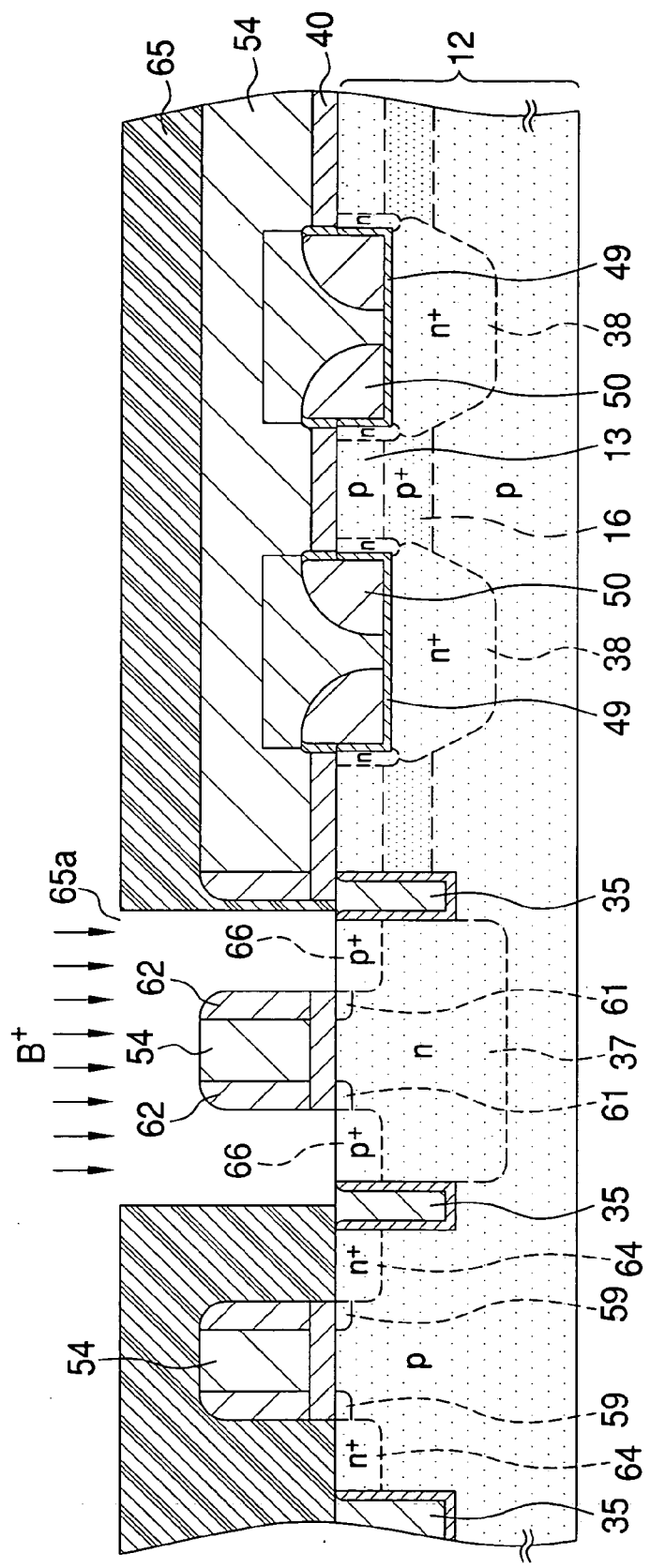

After removal of the resist mask 63 by the ashing process and the washing process, the photo resist is coated on the whole surface, and the photo resist is subject to the exposure process through the photo mask and the development process, so a resist mask 65 having an opening 65a in the P type MOS transistor formation area is formed, as shown in FIG. 42. Then, P type impurity ions (e.g. B$^+$ ions) are implanted in the area of the opening 65a of the resist mask 65, so a P type diffusion region 66 with a high impurity density is formed in the surface of the N type well region 37. The P type diffusion region 66, formed in the area deeper than the P type area 61, constitutes the source/drain of the P type MOS transistor.

Figure 43:
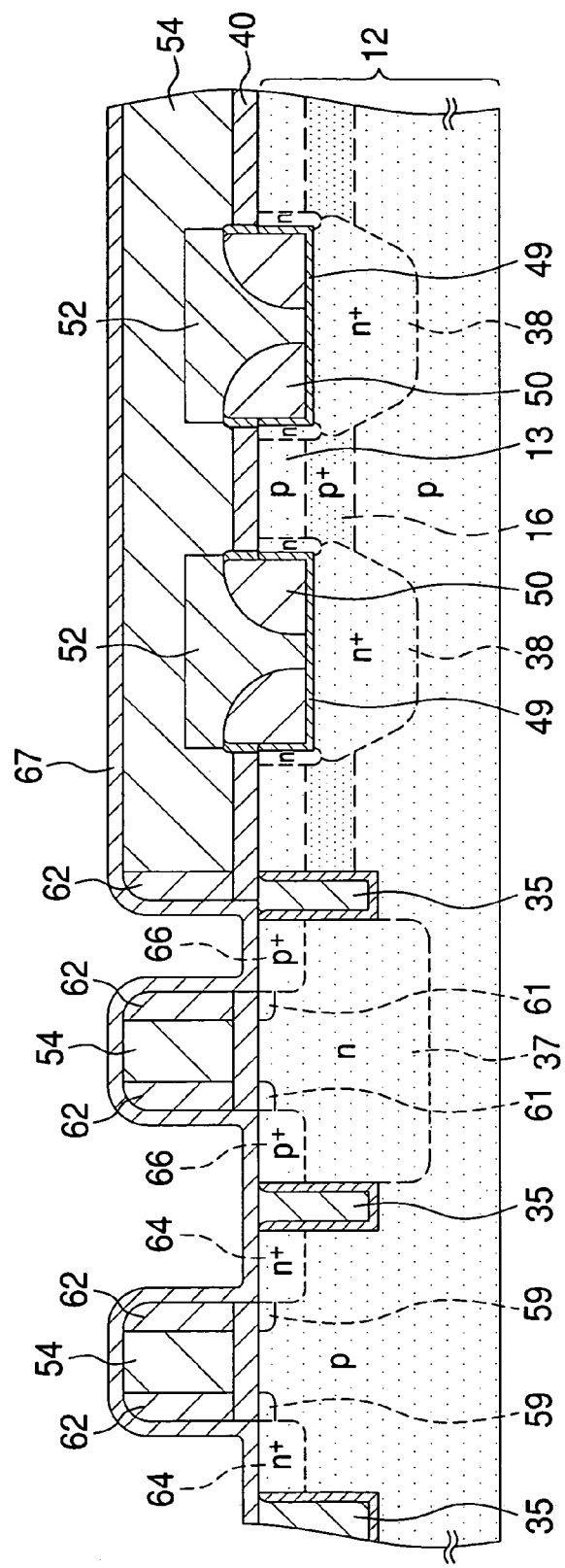
Figure 44:
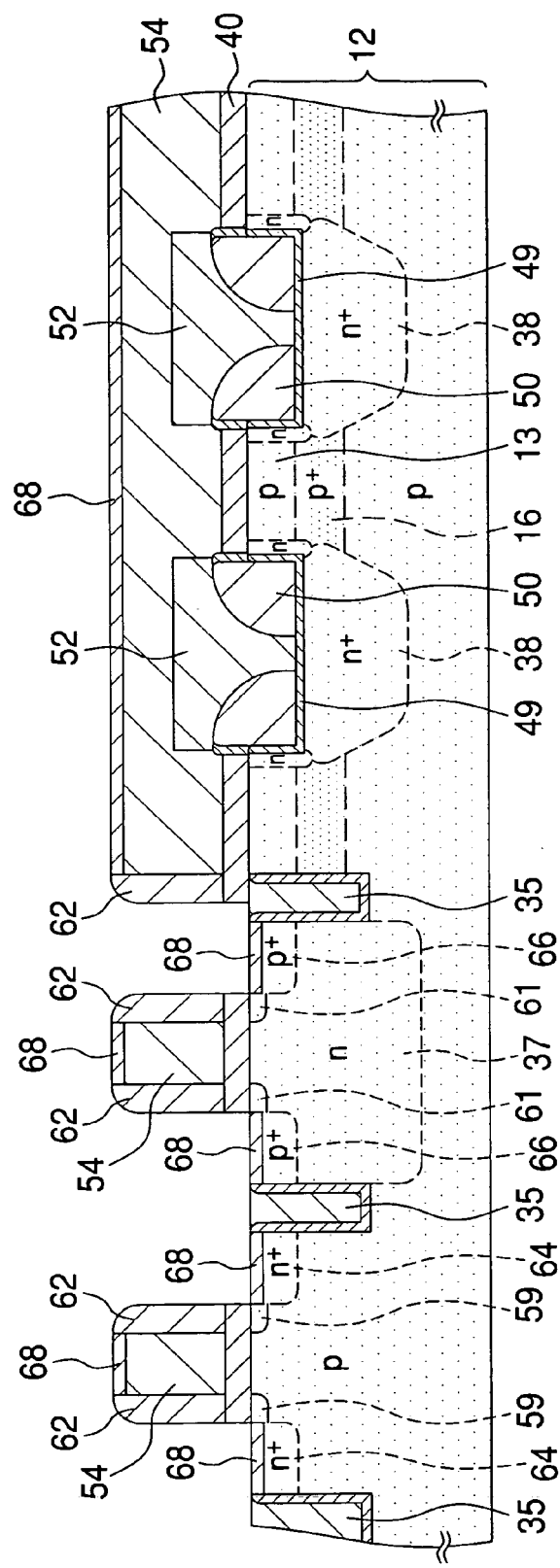

After removal of the resist mask 65 by the ashing process and the washing process, the thermal process is carried out to activate the impurities in the N type diffusion area 64, the N type area 59, the P type diffusion area 66 and the P type area 61. As shown in FIG. 43, a thin cobalt (Co) layer 67 is formed on the whole surface, and the thermal process is carried out. Thereby, the cobalt layer 67 is reacted to silicon in the area contacting the conductive silicon 54 or the silicon substrate 12, so cobalt silicide (CoSi) is formed. When the non-reacted cobalt layer 67 is removed by solution, a silicide layer 68 is formed in the surface of the conductive silicon 54 and the silicon substrate 12 (diffusion area 64, 66), as shown in FIG. 44.

Figure 45:
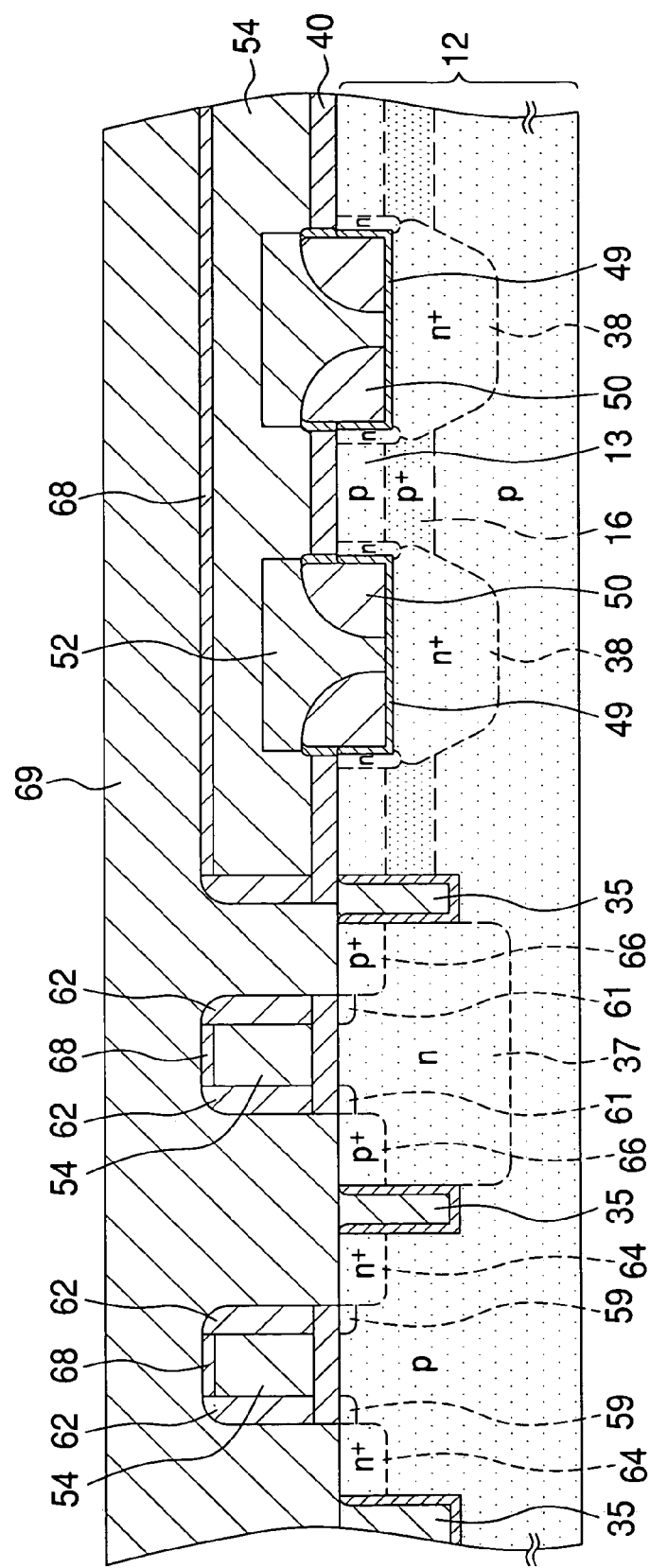
Figure 46:
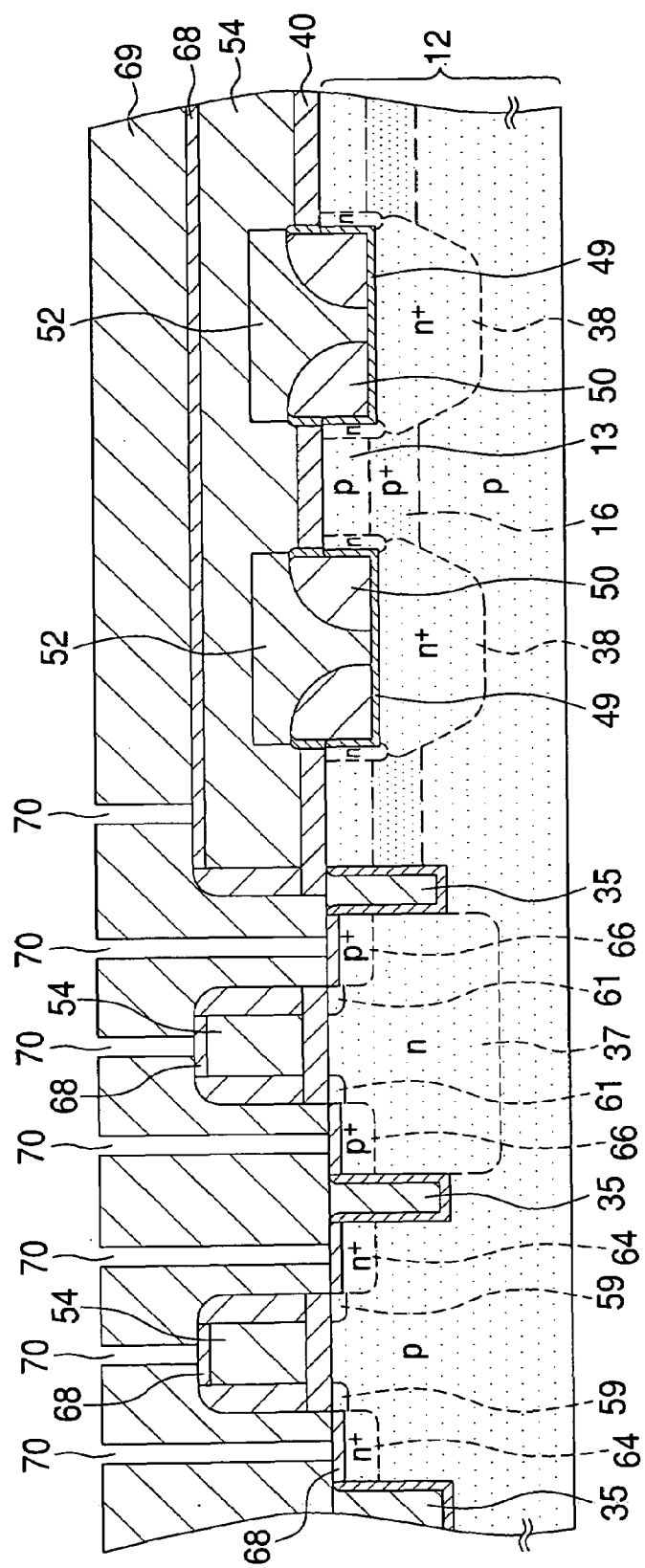

Referring to FIG. 45, a silicon oxide layer 69 is deposited on the whole surface by CVD process, and the surface of the silicon oxide layer 69 becomes flat by CMP process. Thereafter, plural contact holes 70 to expose the silicide layer 68 are formed by the etching process through a resist mask (not illustrated), as shown in FIG. 46.

Figure 47:
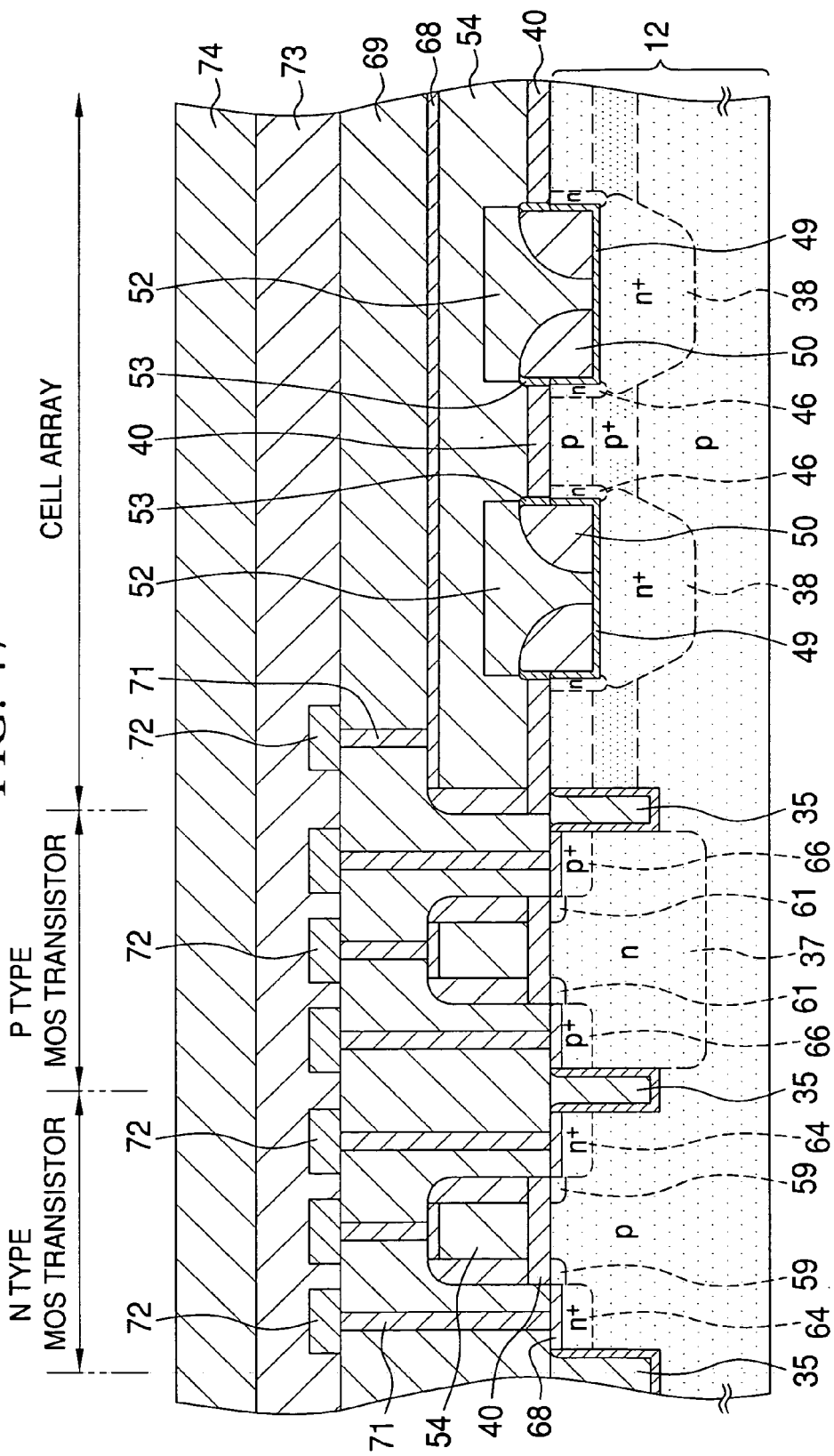

Referring to FIG. 47, the contact holes 70 are filled with tungsten to form tungsten plugs 71 by depositing tungsten on the whole surface and polishing the surface by CMP process. Then, after depositing an aluminum (Al) layer 72, the aluminum layer 72 is subject to the patterning process to form an aluminum pattern 72 contacting the tungsten plugs 71. Then, the aluminum pattern 72 is covered with a silicon oxide layer 73, and a protection layer 74 such as silicon nitride layer is formed on the silicon oxide layer 73. In this way, the semiconductor memory device having the cell array 10 and the CMOS transistor (N type MOS transistor and P type MOS transistor) is manufactured.

In the word line separation area (C-C line) of the cell array 10, the silicon oxide layer 69, the silicon oxide layer 73 and the protection layer 74 are layered on the silicon oxide layer 40, 52 in this order listed.

In the cell array formation area, the silicon oxide layer 49 corresponds to the first insulation layer 17a, 17b of the cell transistor 11 of FIG. 2. The silicon oxide layer 53 corresponds to the second insulation layer 18a, 18b, and the silicon oxide layer 40 corresponds to the third insulation layer 19. The silicon oxide layer 52 corresponds to the insulator 21a, 21b, and the diffusion region 38 corresponds to the diffusion region 14a, 14b (bit line BL). The N type area 46 corresponds to the N type area 15a, 15b, and the conductive silicon 50 corresponds to the floating gate FG1, FG2 of the cell transistor 11. The conductive silicon 54 corresponds to the control gate CG (word line WL).

In the above described manufacture processes, the floating gate FG1, FG2 and the word line WL in the column direction are formed without the self-align process. In other words, after forming the floating gate FG1, FG2 by etching the conductive silicon 50 for the floating gate FG1, FG2, the conductive silicon 54 for the control gate CG is formed on the silicon oxide layer 52 to cover the conductive silicon 50. Then, after forming the resist mask 56 above the conductive silicon 54 via the silicon oxide layer 56, the word line WL is formed by the patterning process of the conductive silicon 54 by use of the resist mask 56. Thus, the silicon oxide layers 49, 53, 40 (corresponding to first, second and third insulation layers), relevant to the operation of the cell transistor 11, are not damaged during the etching process of other silicon oxide layer.

Referring to FIG. 1, the floating gate FG1, FG2 manufactured by the above described processes faces the silicon substrate 12 (diffusion region 14a, 14b, and N type area 15a, 15b) by the width of W1, and the floating gate FG1, FG2 faces the control gate CG by the width W2. Since the width W1 is larger than the width W2 in this embodiment, the coupling ratio (the value of the coupling capacitance $C_{CF}$ to the control gate divided by the coupling capacitance $C_{SF}$ to the silicon substrate 12) of the floating gate FG1, FG2 decreases, compared with the conventional case in which the width W1 is the same as the width W2. Such decrease in the coupling ratio indicates that the floating gate FG1, FG2 is strongly coupled to the silicon substrate 12 (source/drain), and thus the current window (the difference in the readout current Id at the output data Dout of '0' and '1') in the readout operation is increased. Moreover, since the potential between the floating gate Fg1, FG2 and the control gate CG increases, it is possible to decrease the application voltage in the erasing operation.

Figure 53:
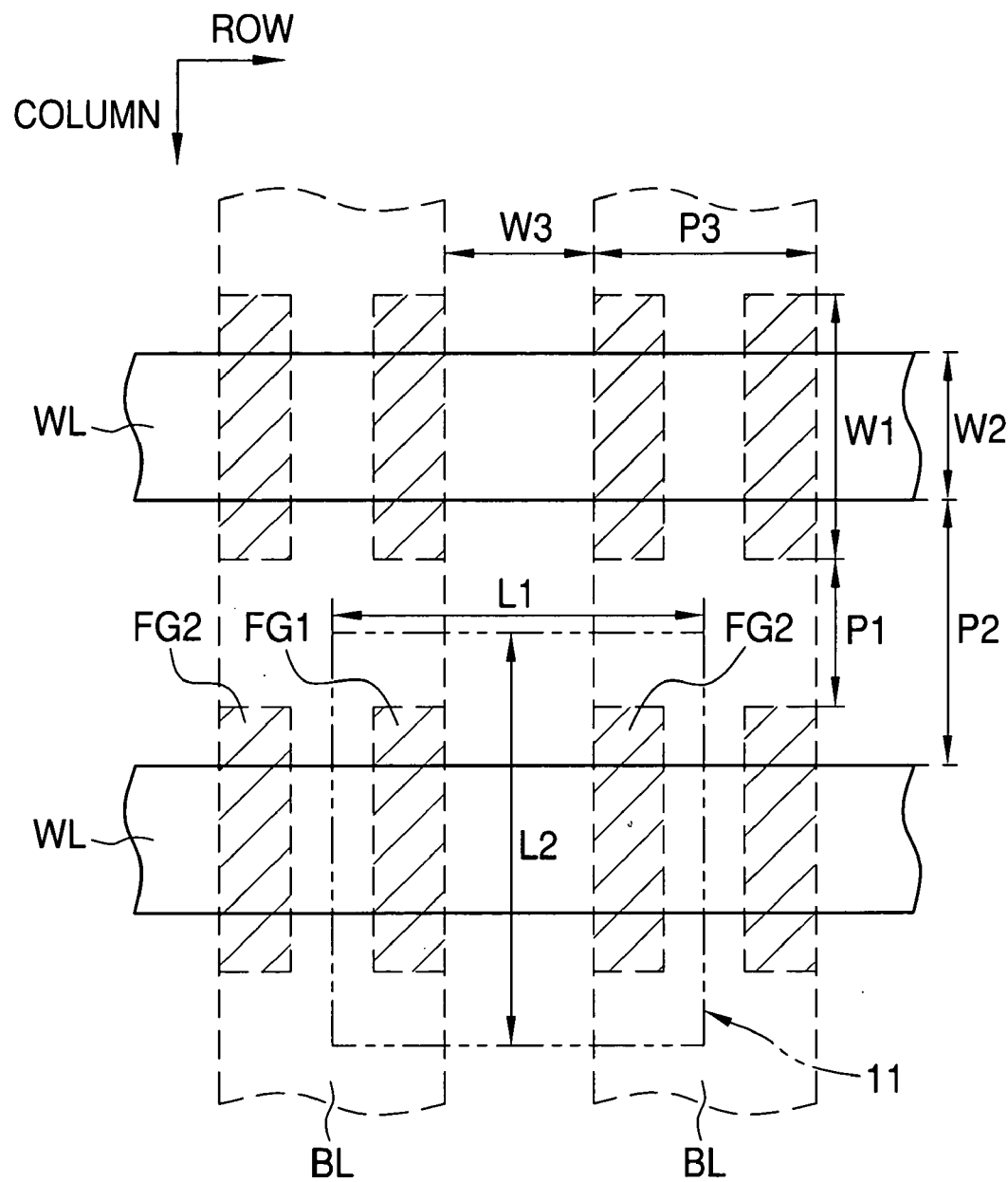
FIG. 53 is an explanatory view to explain the size of the single cell array.
Figure 54:
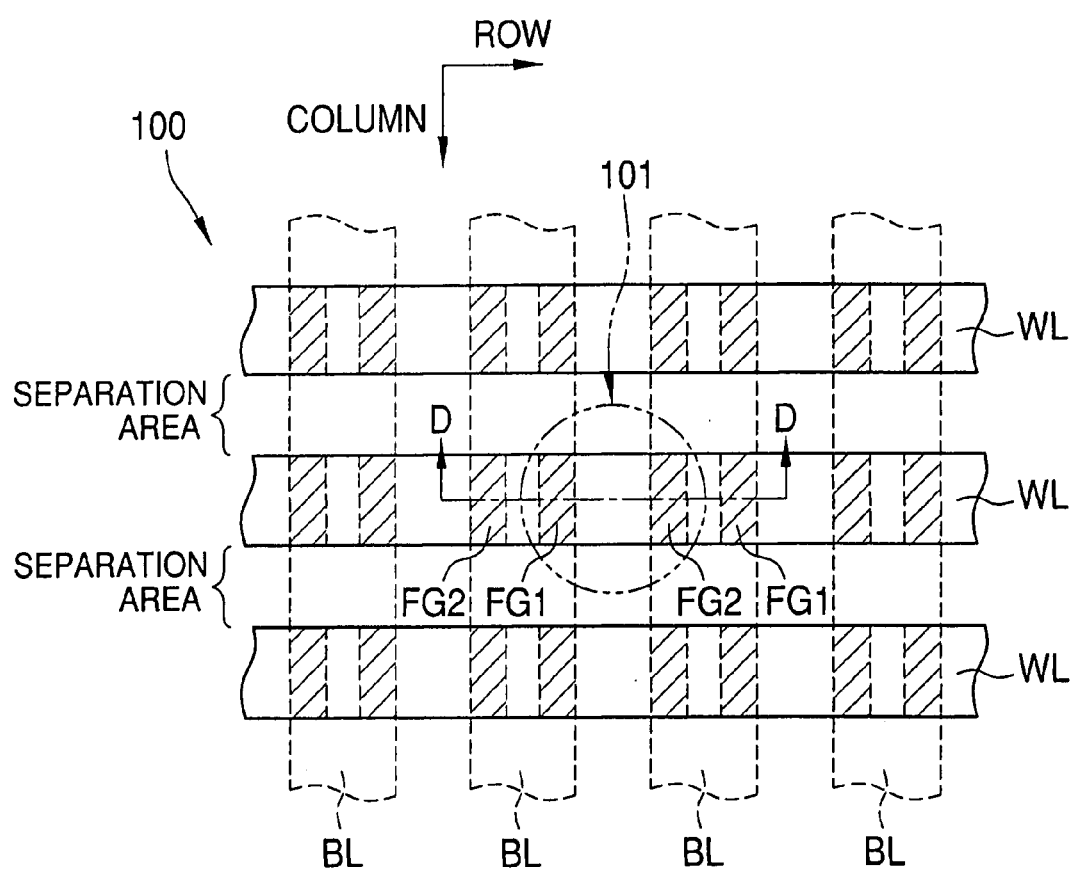
FIG. 54 is a section showing a structure of a conventional cell transistor.
Figure 55:
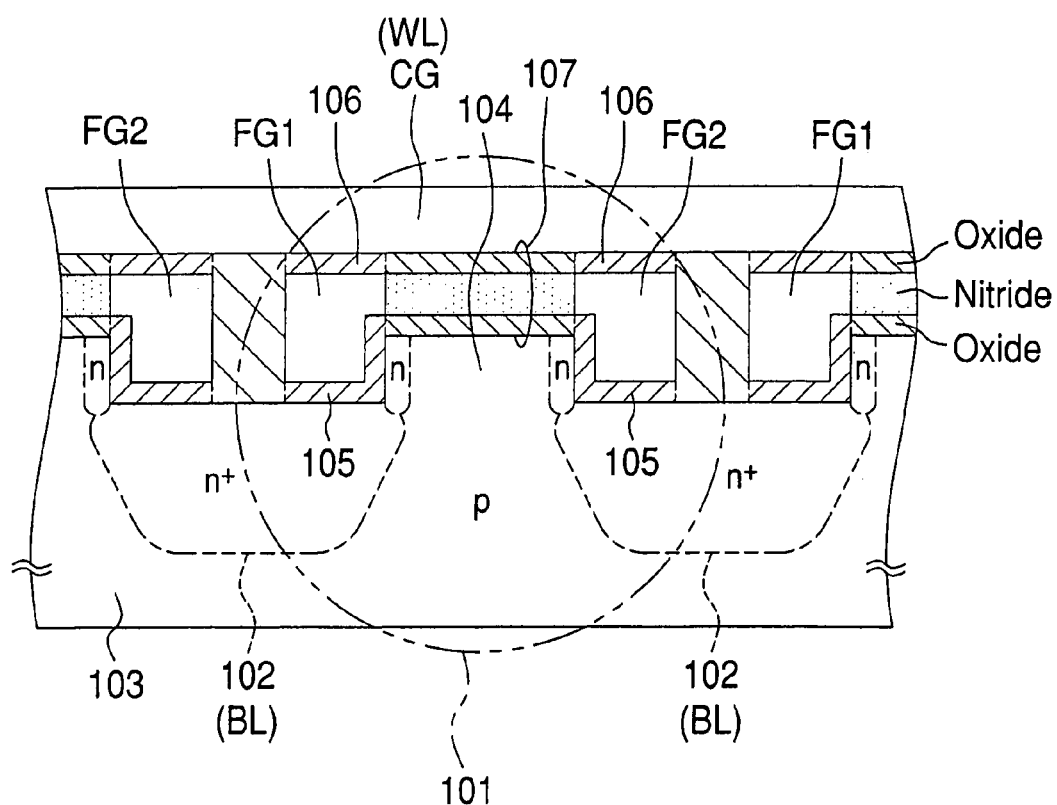
FIG. 55 is a cross section of a cell transistor taken on the line D-D of FIG. 54.

In FIG. 53, the plan view of the single cell transistor 11 is depicted. The cell transistor 11 has the rectangular shape, and the length L1 in the row direction is (W3+P3). The length L2 of the cell transistor 11 in the column direction is (W1+P1), that is equal to (W2+P2). In the condition of W3=90 nm, P3=135 nm, W1=162 nm and P1=90 nm, L1 is 225 nm(=2.5 F), and L2 is 252 nm(=2.8 F) under the minimum design rule of 90 nm(=F). In that case, the area of the single cell transistor 11 is 7.0 F$^2$. Since the cell transistor 11 can store the data of 2 bits or more, so the area of the single bit is 3.5 $F^2$ in the event of two bits per single cell transistor.

In the above embodiment, the cell array 10 and the N type MOS transistor are formed on the P type silicon substrate 12, and the P type MOS transistor is formed in the N type well area 37. The present invention is not limited to such configuration, and the cell array 10 and/or the N type MOS transistor may be formed in the P type well area formed in the silicon substrate 12. For example, for the purpose of forming such P type well area, P type impurity ions may be deeply implanted in the silicon substrate by use of the resist mask 38 before the process shown in FIG. 14.

In the above embodiment, the conductive type of the silicon substrate 12 (one conductive type) is P type and that of the diffusion regions 14a, 14b (opposite conductive type) is N type. The present invention is not limited to them, but the conductive type of the silicon substrate (one conductive type) and the conductive type of the diffusion region 14a, 14b may be N type and P type, respectively.

The above embodiments do not limit the scope of the present invention. Various changes and modifications are possible in the present invention and may be understood to be within the scope of the present invention. For instance, the processes shown in FIG. 13 may be carried out after the process of FIG. 14, so the N type well area 37 is formed after formation of the high impurity density layer 16.

As for the CMOS circuit fabricated in the same substrate as the cell array except the surrounding circuit shown in FIG. 3, the semiconductor circuits such as SRAM (Static Random Access Memory) and FPGA (Field Programmable Gate Array) are also applicable.

What is claimed is:

1. A method for manufacturing the semiconductor memory having plural cell transistors, the method comprising the steps of:

(a) forming plural trenches extending in a first direction in the semiconductor substrate to form plural projections each of which has a pair of side surfaces;

(b) implanting opposite type impurity ions to the trenches to form opposite conductive type regions in the semiconductor substrate, the opposite conductive type regions serving as the source and the gate of the cell transistor;

(c) forming a first insulation layer in the surface of the opposite conductive type region and the side surface of the projection;

(d) depositing first conductive material on both side surfaces and on the opposite conductive type region to form floating gates, the floating gate having a side surface that faces the projection via the first insulation layer;

(e) dividing the first conductive material with respect to the first direction to form a pair of floating gates, the floating gate having a side surface that faces the projection via the first insulation layer;

(f) depositing a second conductive material on the whole surface; and (g) forming a control gate by etching the portion of the second conductive material that is not covered with a stripe-shaped resist mask extending in a second direction perpendicular to the first direction, the control gate facing the top side of the projection via a second insulation layer, and the width of the resist mask in the first direction being smaller than the width floating gate.

2. The method according to claim 1, wherein the step (g) comprising the steps of:

(g1) depositing a mask insulation layer on the second conductive material;

(g2) forming the resist mask on the mask insulation layer;

(g3) etching the portion of the mask insulation layer that is not covered with the resist mask;

(g4) removing the resist mask; and (g5) etching the portion of the second conductive material that is not covered with the mask insulation layer.

3. The method according to claim 1, further comprising the step of:

(h) forming a third insulation layer in the part of the side surface of the floating gate that is not covered with the first insulation layer.

* * * * *